United States Patent
Hayata et al.

(10) Patent No.: US 8,076,976 B2
(45) Date of Patent: Dec. 13, 2011

(54) SEMICONDUCTOR DEVICE

(75) Inventors: Kanji Hayata, Tokyo (JP); Akira Kuriyama, Kodaira (JP); Masatoshi Hase, Kokubunji (JP); Hidetoshi Matsumoto, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/647,688

(22) Filed: Dec. 28, 2009

(65) Prior Publication Data
US 2010/0225401 A1 Sep. 9, 2010

(30) Foreign Application Priority Data
Mar. 4, 2009 (JP) ................................. 2009-051203

(51) Int. Cl.
*H03F 3/68* (2006.01)
(52) U.S. Cl. ..................... 330/295; 330/124 R
(58) Field of Classification Search .................. 330/295, 330/124 R, 53–54, 286, 310
See application file for complete search history.

(56) References Cited

U.S. PATENT DOCUMENTS
7,486,134 B2 * 2/2009 Chang et al. ................... 330/51
2008/0125061 A1 5/2008 Kuriyama et al.

FOREIGN PATENT DOCUMENTS
JP 2008-135822 A 6/2008
* cited by examiner

*Primary Examiner* — Hieu Nguyen
(74) *Attorney, Agent, or Firm* — Mattingly & Malur, PC

(57) ABSTRACT

The present invention provides a technology capable of achieving an improvement in the characteristic of a power amplifier when a power amplifier mounted onto mobile communication equipment such as a cellular phone is comprised of the balance amplifier. One feature of an embodiment resides in that each of passive parts disposed in a low-band signal negative path and each of passive parts disposed in a low-band signal positive path are placed in positions where they are symmetric with respect to a center line of a semiconductor chip. Thus, the symmetry between the low-band signal negative path and the low-band signal positive path is enhanced. As a result, a loss in matching due to the difference between the low-band signal negative path and the low-band signal positive path can be enough reduced, and the characteristic of a low-band signal balance amplifier can be enhanced.

10 Claims, 16 Drawing Sheets

SEMICONDUCTOR DEVICE

CROSS-REFERENCE TO RELATED APPLICATIONS

The disclosure of Japanese Patent Application No. 2009-51203 filed on Mar. 4, 2009 including the specification, drawings and abstract is incorporated herein by reference in its entirety.

BACKGROUND OF THE INVENTION

The present invention relates to a semiconductor device, and particularly to a technology effective if applied to a semiconductor device used in mobile communication equipment such as a cellular phone.

A configuration of a power amplifier for amplifying a transmit signal has been described in Japanese Unexamined Patent Publication No. 2008-135822 (patent document 1). The power amplifier described in the patent document 1 has two amplifying paths for transferring transmit signals having a phase difference of 90° with respect to each other. Namely, the power amplifier described in the patent document 1 is of a power amplifier which amplifies transmit signals having a phase difference of 90° respectively, and thereafter combines respective power of the transmit signals by means of a power coupler and outputs the same. A so-called configuration of balance amplifier has been described therein.

SUMMARY OF THE INVENTION

Mobile communication equipment (e.g., cellular phone) typified by each of communication systems such as a GSM (Global System for Mobile Communications) system, a PCS (Personal Communication Systems) system, a PDC (Personal Digital Cellular) system, and a CDMA (Code Division Multiple Access) system has recently been in widespread use on a worldwide basis. In general, this type of mobile communication equipment comprises an antenna for performing radiation and reception of a radio wave, an antenna switch for switching transmission and reception at the antenna, a power amplifier (PA module) for amplifying a power-modulated high-frequency signal and supplying it to the antenna, a reception unit for processing the high-frequency signal received by the antenna, a control unit for performing control on them, and a battery for supplying a source voltage to them.

The power amplifier contained in the cellular phone comprises, for example, a single amplifier in which an amplifying path for amplifying a transmit signal is single. Namely, while the single amplifier inputs a transmit signal therein and amplifies it and thereafter outputs the amplified transmit signal, a path used for inputting the transmit signal and amplifying it and thereafter outputting the amplified transmit signal is provided as a single path. In the single amplifier at this time, the transmit signal whose power is amplified by the single amplifier is outputted to the antenna. The single amplifier is accompanied by a problem that a fluctuation in the transmit signal outputted from the single amplifier is liable to occur due to fluctuations in load coupled to the single amplifier. Namely, when operations such as contact of the antenna with a metal substance, holding of the antenna with hand, and the like are added, the load coupled to the output of the single amplifier fluctuates. With the fluctuations in the load, the impedance of the load changes. Consequently, the power of the transmit signal outputted from the single amplifier fluctuates. When, for example, the power of the transmit signal outputted from the single amplifier becomes larger than a prescribed range due to the fluctuations in power, it adversely affects the body of a human being who makes use of mobile communication equipment. On the other hand, when the power thereof becomes smaller than the prescribed range of the transmit signal outputted from the signal amplifier due to the power fluctuations, the transmission of the mobile communication equipment is interrupted.

It has thus been examined by the present inventors et al. that the power amplifier is comprised of a balance amplifier to make it harder to affect the power of the transmit signal outputted from the power amplifier by the fluctuations in the load. The balance amplifier has two amplifying paths through which transmit signals having a phase difference of 90° with respect to each other are transmitted. Finally, the transmit signals transmitted over the two amplifying paths reach a single output by means of a power coupler. According to the balance amplifier, an advantage is brought about in that since the phases of the transmit signals transferred through the two amplifying paths are shifted by 90°, the output from the balance amplifier can be controlled approximately constant even though the load coupled to the output terminal of the balance amplifier fluctuates. Namely, in the balance amplifier, when one of the two amplifying paths changes to high impedance due to the fluctuations in the load, the other thereof changes to low impedance with respect to the fluctuations in the load. Therefore, when the transmit signals transferred through the two amplifying paths are combined together, the changes in the power of the transmit signals with respect to the fluctuations in the load can complement each other. As a result, the power of the transmit signal outputted from the balance amplifier can be kept approximately constant regardless of the fluctuations in the load. Thus, the power amplifier resistant to the fluctuations in the load can be configured by configuring the power amplifier from the balance amplifier.

Various application functions as well as voice calling functions have been added to a recent cellular phone. Namely, functions other than voice calling functions such as listening to delivery music, transmission of moving pictures, data transfer and the like using a cellular phone have been added to the cellular phone. With multifunctioning of such a cellular phone, frequency bands (GSM (Global System for Mobile communication) band, PCS (Personal Communication Services) band, etc.), modulation schemes (GSM, EDGE (Enhanced Data rates for GSM Evolution), WCDMA (Wideband Code Division Multiplex Access), etc.) around the world exist in large numbers. Thus, the cellular phone needs to cope with transmit-receive signals corresponding to a plurality of different frequency bands and different modulation schemes. From this point of view, even a power amplifier that exists in the cellular phone needs to have functions for amplifying signals lying in different frequency bands respectively. It has been practised to enable transmit signals lying in different frequency bands to be amplified within one semiconductor chip that configures the power amplifier. Namely, considering where, for example, transmit signals (called low-band signal and high-band signal) lying in two different frequency bands are amplified, an amplifier circuit for the low-band signal and an amplifier circuit for the high-band signal are formed in one semiconductor chip. In this case, when each low-band signal amplifying path and each high-band signal amplifying path perform signal transfer between wirings close to each other, the coupling capacitance between the wirings close to each other becomes large, so that crosstalk between the low-band and high-band signals becomes manifest as a problem. Even when amplifying paths of a dual band-based power amplifier are respectively comprised of balance amplifiers, crosstalk between low-band and high-band signals becomes a problem. Further, there is a need to devise the layout of two amplifying paths for transmitting transmit signals different in phase by 90° from each other with a view toward improving the characteristic of each balance amplifier.

An object of the present invention is to provide a technology capable of achieving an improvement in the characteristic of the balance amplifier when a power amplifier mounted to mobile communication equipment such as a cellular phone or the like is comprised of the balance amplifier.

The above, other objects and novel features of the present invention will become apparent from the description of the present specification and the accompanying drawings.

A summary of a typical one of the inventions disclosed in the present application will be explained in brief as follows:

A semiconductor device according to a representative embodiment is of a semiconductor device comprising a balance amplifier type power amplifier comprised of an amplifier for a negative path and an amplifier for a positive path. The semiconductor device comprises (a) a wiring board and (b) a semiconductor chip mounted over the wiring board and comprising a plurality of transistors that configure the power amplifier. Here, the wiring board is formed with (c1) a first passive element that configures a matching circuit electrically coupled to the amplifier for the negative path, and (c2) a second passive element that configures a matching circuit electrically coupled to the amplifier for the positive path. The wiring board has first and second regions divided by a first straight line that passes through the center of the semiconductor chip. The first passive element is disposed in the first region, and the second passive element is disposed in the second region.

An advantageous effect obtained by a typical one of the inventions disclosed in the present application will be explained in brief as follows:

A characteristic of a semiconductor device can be improved. Particularly when a power amplifier mounted onto mobile communication equipment such as a cellular phone or the like is comprised of a balance amplifier, an improvement in the characteristic of the balance amplifier can be achieved.

DETAILED DESCRIPTION OF THE PREFERRED EMBODIMENTS

Figure 1:
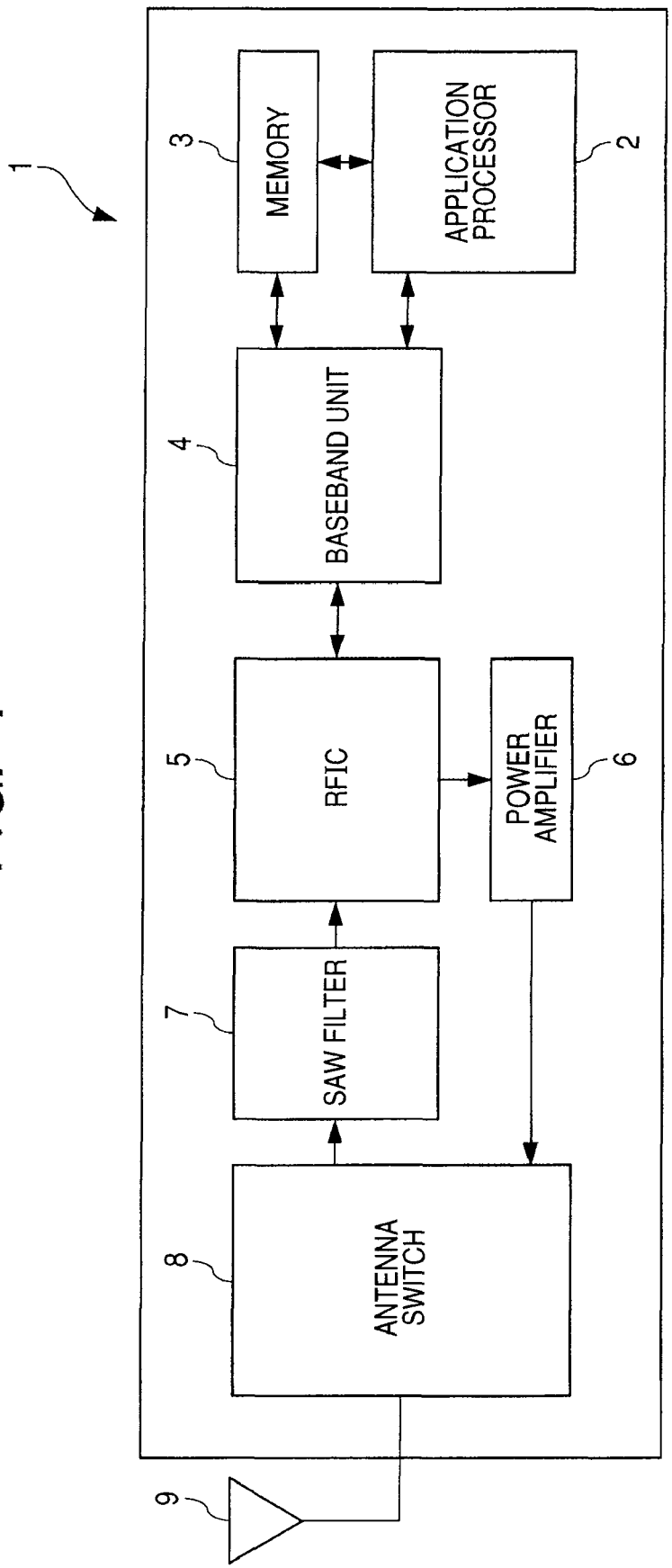
FIG. 1 is a block diagram showing a configuration of a transceiver section of a cellular phone.

The invention will be described by being divided into a plurality of sections or embodiments whenever circumstances require it for convenience in the following embodiments. However, unless otherwise specified in particular, they are not irrelevant to one another. One thereof has to do with modifications, details and supplementary explanations of some or all of the other.

When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle.

It is further needless to say that components (including element or factor steps, etc.) employed in the following embodiments are not always essential unless otherwise specified in particular and considered to be definitely essential in principle.

Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range.

The same reference numerals are respectively attached to the same components or members in all the drawings for describing the embodiments in principle, and their repetitive explanations will be omitted. Incidentally, some hatching might be provided to make it easy to view the drawings even in the case of plan views.

First Embodiment

<<Configuration of Transceiver Section>>

FIG. 1 is a block diagram showing a configuration of a transceiver section of a cellular phone. As shown in FIG. 1, the cellular phone 1 has an application processor 2, a memory 3, a baseband unit 4, an RFIC 5, a power amplifier 6, a SAW (Surface Acoustic Wave) filter 7, an antenna switch 8 and an antenna 9.

The application processor 2 comprises, for example, a CPU (Central Processing Unit) and has the function of realizing an application function of the cellular phone 1. Described concretely, the application processor 2 reads an instruction from the memory 3, decodes it and performs various arithmetic operations and control, based on the result of decoding thereby to realize the application function. The memory 3 has the function of storing data therein and stores therein, for example, a program for operating the application processor 2 and processing data at the application processor 2. Further, the memory 3 is capable of obtaining access not only to the application processor 2 but also to the baseband unit 4 and can be used even for the storage of data processed at the baseband unit.

The baseband unit 4 has a CPU corresponding to a central control unit built therein. The baseband unit 4 digitally processes an audio signal (analog signal) from a user (calling party) via an operation unit upon transmission to make it possible to generate a baseband signal. On other hand, the baseband unit 4 is capable of generating an audio signal from the baseband signal corresponding to a digital signal.

The RFIC 5 is capable of modulating the baseband signal upon transmission to generate a radio frequency signal and demodulating a receive signal upon reception to generate a baseband signal. The power amplifier 6 is of a circuit which newly generates a high power signal analogous to a weak input signal by power supplied from a power supply. The SAW filter 7 allows only signals lying in a predetermined frequency band from the receive signal to pass therethrough.

The antenna switch 8 is provided to separate the receive signal inputted to the cellular phone 1 and a transmit signal outputted from the cellular phone 1 from each other. The antenna 9 is provided to transmit and receive a radio wave.

The cellular phone 1 is configured in the above-described manner. The operation thereof will be explained below in brief. A description will first be made of a case in which a signal is transmitted. A baseband signal generated by digitally processing an analog signal such as an audio signal by means of the baseband unit 4 is inputted to the RFIC 5. The RFIC 5 converts the baseband signal to a signal of a radio frequency (RF (Radio Frequency) frequency) by a modulation signal source and a mixer. The signal converted to the RF signal is outputted from the RFIC 5 to the power amplifier (PA module) 6. The RF signal inputted to the power amplifier 6 is amplified by the power amplifier 6 and thereafter transmitted from the antenna 9 via the antenna switch 8.

A description will next be made of a case in which a signal is received. The RF signal (received signal) received by the antenna 9 passes through the SAW filter 7 and is thereafter inputted to the RFIC 5. The RFIC 5 amplifies the received signal and thereafter performs its frequency conversion by the modulation signal source and the mixer. Then, the frequency-converted signal is detected to extract a baseband signal. Thereafter, the baseband signal is outputted from the RFIC 5 to the baseband unit 4. The baseband signal is processed by the baseband unit 4 from which an audio signal is outputted.

As described above, upon transmission of the signal from the digital cellular phone, the signal is amplified by the power amplifier 6 and thereafter outputted from the antennal 9 via the antenna switch 8.

<<Configuration of PA Module (Single Amplifier)>>

Figure 2:
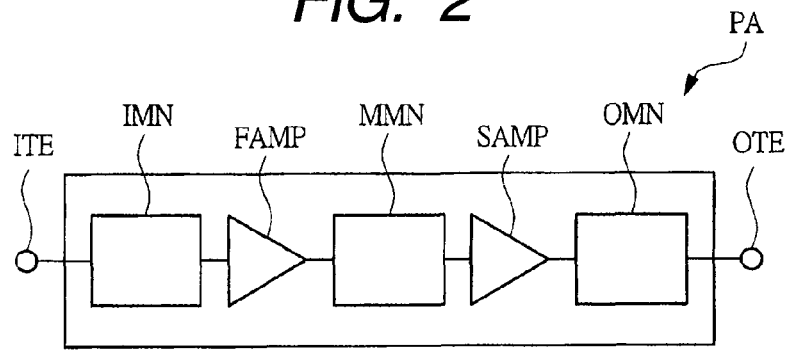
FIG. 2 is a block diagram illustrating an example in which a PA module comprises a single amplifier.

A circuit block configuration of the PA module PA (power amplifier 6 shown in FIG. 1) will be explained below. First, FIG. 2 is a circuit block diagram showing an example in which the PA module PA is comprised of a single amplifier. The single amplifier is assumed to be called a PA module PA in which a path used for amplifying a transmit signal is configured as a single path. In FIG. 2, the PA module PA has an input matching circuit IMN, a first-stage amplifier FAMP, an inter-stage matching circuit MMN, a last-stage amplifier SAMP and an output matching circuit OMN, which are provided between an input terminal ITE and an output terminal OTE.

The input matching circuit IMN is of a circuit for outputting a signal (transmit signal) inputted from the input terminal ITE to the first-stage amplifier FAMP efficiently. Described specifically, the input matching circuit IMN comprises passive parts such as a capacitive element, an inductor element and the like, which are combined so as to be able to provide impedance matching with the input signal.

The first-stage amplifier FAMP comprises is capable of amplifying the power of the transmit signal outputted from the input matching circuit IMN. For example, a compound semiconductor device such as an HBT, an HEMT or the like, a silicon bipolar transistor, an LDMOSFET (Laterally Diffused Metal Oxide Semiconductor Field Effect Transistor: laterally diffused MOSFET) and the like are used for the first-stag amplifier FAMP according to purposes and situations.

The inter-stage matching circuit MMN is of a circuit for transmitting the transmit signal amplified by the first-stage amplifier FAMP to the last-stage amplifier SAMP efficiently. Described concretely, the inter-stage matching circuit MMN comprises passive parts such as a capacitive element, an inductor element, etc., which are combined so as to be capable of impedance matching with the transmit signal.

The last-stage amplifier SAMP is capable of amplifying the power of the transmit signal outputted from the inter-stage matching circuit MMN. For example, a compound semiconductor device such as an HBT, an HEMT or the like, a silicon bipolar transistor, an LDMOSFET (Laterally Diffused Metal Oxide Semiconductor Field Effect Transistor: laterally diffused MOSFET) and the like are used even for the last-stage amplifier SAMP according to purposes and situations in a manner similar to the first-stage amplifier FAMP.

The output matching circuit OMN is of a circuit for outputting the transmit signal amplified by the last-stage amplifier SAMP from the output terminal OTE efficiently. Described specifically, the output matching circuit OMN comprises passive parts such as a capacitive element, an inductor element, etc., which are combined so as to be capable of providing impedance matching with the transmit signal.

The PA module PA comprised of the single amplifier is configured as described above. The operation thereof will be explained below with reference to FIG. 2. When a transmit signal is inputted to the input terminal ITE, the transmit signal is inputted from the input terminal ITE to the input matching circuit IMN. Since the input matching circuit IMN is configured to provide impedance matching with the transmit signal, the transmit signal inputted to the input matching circuit IMN is suppressed in reflection and efficiently outputted from the input matching circuit IMN.

Subsequently, the transmit signal outputted from the input matching circuit IMN is inputted to the first-stage amplifier FAMP. The first-stage amplifier FAMP amplifies the power of the transmit signal. Then, the transmit signal amplified by the first-stage amplifier FAMP is inputted to the inter-stage matching circuit MMN. Since, at this time, the inter-stage matching circuit MMN also perform impedance matching with the transmit signal, the transmit signal is efficiently outputted from the inter-stage matching circuit MMN.

Thereafter, the transmit signal outputted from the inter-stage matching circuit MMN is inputted to the last-stage amplifier SAMP. The last-stage amplifier SAMP amplifies the power of the transmit signal. Then, the transmit signal amplified by the last-stage amplifier SAMP is inputted to the output matching circuit OMN. Since the output matching circuit OMN also performs impedance matching with the transmit signal, the transmit signal is efficiently outputted from the output matching circuit OMN. The transmit signal outputted from the output matching circuit OMN is outputted to the outside of the PA module PA via the output terminal OTE. As described above, the power of the transmit signal can be amplified by the PA module PA.

In the PA module PA configured in this way, the transmit signal whose power has been amplified by the PA module PA, is outputted to its corresponding antenna. At this time, a problem arises in that when the PA module PA is comprised of a single amplifier, a variation in the transmit signal outputted from the single amplifier is easy to occur due to fluctuations in load coupled to the single amplifier. When, for example, the power of the transmit signal outputted from the single amplifier becomes larger than a prescribed range due to power fluctuations, it adversely affects the body of a human being who makes use of a mobile communication apparatus or equipment. On the other hand, when the power thereof becomes smaller than the prescribed range of the transmit signal outputted from the signal amplifier due to the power fluctuations, the transmission of the mobile communication equipment is interrupted.

<<Configuration of Pa Module (Balance Amplifier>>

It has thus been examined that the PA module PA is comprised of a balance amplifier to make it harder to affect the power of the transmit signal outputted from the PA module PA by the fluctuations in the load. The balance amplifier has two amplifying paths through which transmit signals having a phase difference of 90° with respect to each other are transmitted. Eventually, the transmit signals transmitted over the two amplifying paths reach a single output by means of a power coupler.

Figure 3:
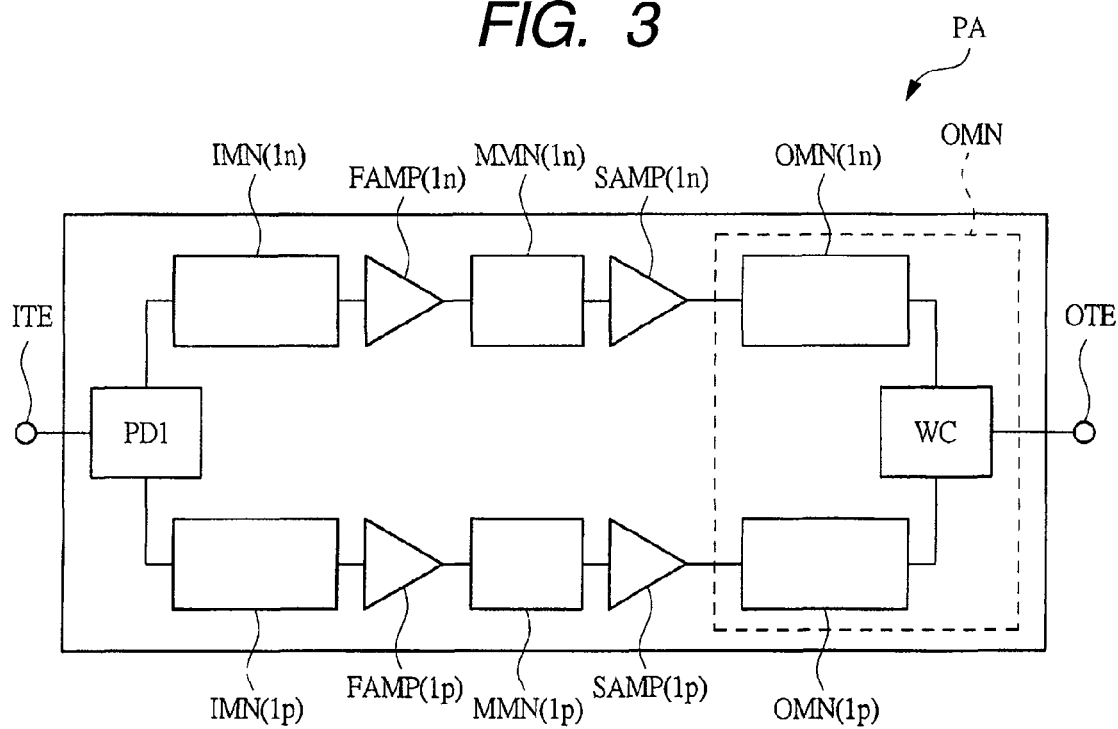
FIG. 3 is a block diagram depicting an example in which a PA module comprises a balance amplifier.

FIG. 3 is a circuit block diagram showing an example in which the PA module PA is comprised of a balance amplifier. In the balance amplifier shown in FIG. 3, two amplifying paths exist between an input terminal ITE and an output terminal OTE. Of the two amplifying paths, one amplifying path is called "negative path" and the other amplifying path is called "positive path". The negative path and the positive path are branched by a power divider PD1 coupled to the same input terminal ITE.

A configuration of the negative path will first be explained. At the negative path, an input matching circuit IMN (1n), a first-stage amplifier FAMP (1n), an inter-stage matching circuit MMN (1n), a last-stage amplifier SAMP (1n) and an output matching circuit OMN (1n) are provided between the power divider PD1 and a power coupler WC.

The input matching circuit IMN (1n) is of a circuit for efficiently outputting an input signal (transmit signal) divided by the power divider PD1 to the first-stage amplifier FAMP (1n). Described concretely, the input matching circuit IMN (1n) comprises passive parts such as a capacitive element, an inductor element, etc., which are combined so as to be capable of providing impedance matching with the input signal. The input matching circuit IMN (1n) has the function of performing impedance matching and the function of adjusting the phase of the transmit signal transferred through the input matching circuit IMN (1n). Namely, since the transmit signals transmitted through the negative path and the positive path are made different by 90° in phase from each other at the balance amplifier, the phase of the transmit signal transmitted through the negative path is first adjusted by the input matching circuit IMN (1n) inputted with the transmit signal divided by the power divider PD1.

The first-stage amplifier FAMP (1n) is capable of amplifying the power of the transmit signal outputted from the input matching circuit IMN (1n). For example, a compound semiconductor device such as an HBT, an HEMT or the like, a silicon bipolar transistor, an LDMOSFET (Laterally Diffused Metal Oxide Semiconductor Field Effect Transistor: laterally diffused MOSFET) and the like are used for the first-stage amplifier FAMP (1n) according to purposes and situations.

The inter-stage matching circuit MMN (1n) is of a circuit for transmitting the transmit signal amplified by the first-stage amplifier FAMP (1n) to the last-stage amplifier SAMP (1n) efficiently. Described concretely, the inter-stage matching circuit MMN (1n) comprises passive parts such as a capacitive element, an inductor element, etc., which are combined so as to be capable of providing impedance matching with the transmit signal.

The last-stage amplifier SAMP (1n) is capable of amplifying the power of the transmit signal outputted from the inter-stage matching circuit MMN (1n). For example, a compound semiconductor device such as an HBT, an HEMT or the like, a silicon bipolar transistor, an LDMOSFET (Laterally Diffused Metal Oxide Semiconductor Field Effect Transistor: laterally diffused MOSFET) and the like are used even for the last-stage amplifier SAMP (1n) according to purposes and situations in a manner similar to the first-stage amplifier FAMP (1n).

The output matching circuit OMN (1n) is of a circuit for outputting the transmit signal amplified by the last-stage amplifier SAMP (1n) from the output terminal OTE efficiently. Described specifically, the output matching circuit OMN (1n) comprises passive parts such as a capacitive element, an inductor element, etc., which are combined so as to be capable of providing impedance matching with the transmit signal. Further, at the balance amplifier, the output matching circuit OMN (1n) also has the function of adjusting the phase of the transmit signal transferred through the negative path along with the function of providing impedance matching. Namely, the transmit signals are adjusted so as to be shifted 90° in phase from each other between the negative path and the positive path at the balance amplifier. Since, however, the transmit signal transmitted through the negative path and the transmit signal transmitted through the positive path are eventually coupled by the power coupler WC, the phase of the transmit signal lying immediately before being input to the power coupler WC is adjusted at the output matching circuit OMN (1n).

A configuration of the positive path will be explained subsequently. At the positive path, an input matching circuit IMN (1p), a first-stage amplifier FAMP (1p), an inter-stage matching circuit MMN (1p), a last-stage amplifier SAMP (1p) and an output matching circuit OMN (1p) are provided between the power divider PD1 and the power coupler WC.

The input matching circuit IMN (1p) is of a circuit for efficiently outputting an input signal (transmit signal) divided by the power divider PD1 to the first-stage amplifier FAMP (1p). Described concretely, the input matching circuit IMN (1p) comprises passive parts such as a capacitive element, an inductor element, etc., which are combined so as to be capable of providing impedance matching with the input signal. The input matching circuit IMN (1p) has the function of providing impedance matching and the function of adjusting the phase of the transmit signal transferred through the input matching circuit IMN (1p). Namely, since the transmit signals transmitted through the negative path and the positive path are made different by 90° in phase from each other at the balance amplifier, the phase of the transmit signal transmitted through the positive path is first adjusted by the input matching circuit IMN (1p) inputted with the transmit signal divided by the power divider PD1.

The first-stage amplifier FAMP (1p) is capable of amplifying the power of the transmit signal outputted from the input matching circuit IMN (1p). For example, a compound semiconductor device such as an HBT, an HEMT or the like, a silicon bipolar transistor, an LDMOSFET (Laterally Diffused Metal Oxide Semiconductor Field Effect Transistor: laterally diffused MOSFET) and the like are used for the first-stage amplifier FAMP (1p) according to purposes and situations.

The inter-stage matching circuit MMN (1p) is of a circuit for transmitting the transmit signal amplified by the first-stage amplifier FAMP (1p) to the last-stage amplifier SAMP (1p) efficiently. Described concretely, the inter-stage matching circuit MMN (1p) comprises passive parts such as a capacitive element, an inductor element, etc., which are combined so as to be capable of providing impedance matching with the transmit signal.

The last-stage amplifier SAMP (1p) is capable of amplifying the power of the transmit signal outputted from the inter-stage matching circuit MMN (1p). For example, a compound semiconductor device such as an HBT, an HEMT or the like, a silicon bipolar transistor, an LDMOSFET (Laterally Diffused Metal Oxide Semiconductor Field Effect Transistor: laterally diffused MOSFET) and the like are used even for the last-stage amplifier SAMP (1p) according to purposes and situations in a manner similar to the first-stage amplifier FAMP (1p).

The output matching circuit OMN (1p) is of a circuit for outputting the transmit signal amplified by the last-stage amplifier SAMP (1p) from the output terminal OTE efficiently. Described specifically, the output matching circuit OMN (1p) comprises passive parts such as a capacitive element, an inductor element, etc., which are combined so as to be capable of providing impedance matching with the transmit signal. Further, at the balance amplifier, the output matching circuit OMN (1p) also has the function of adjusting the phase of the transmit signal transferred through the positive path along with the function of providing impedance matching. Namely, the transmit signals are adjusted so as to be shifted 90° in phase from each other between the negative path and the positive path at the balance amplifier. Since, however, the transmit signal transmitted through the negative path and the transmit signal transmitted through the positive path are eventually coupled by the power coupler WC, the phase of the transmit signal lying immediately before being inputted to the power coupler WC is adjusted at the output matching circuit OMN (1p).

In FIG. 3, the output matching circuit OMN (1n) for the negative path, the output matching circuit OMN (1p) for the positive path and the power coupler WC configure the output matching circuit OMN together with one another.

While the two amplifying paths called the negative path and the positive path exist in the balance amplifier as described above, the feature of the balance amplifier resides in that the phase of the transmit signal transferred through the negative path and the phase of the transmit signal transferred through the positive path are shifted 90° from each other. Namely, as shown in FIG. 3, the phases of the transmit signals outputted from the power divider PD1 to the negative and positive paths through the input terminal ITE are the same. Next, the phases of the transmit signals are adjusted by the input matching circuit IMN (1n) for the negative path and the input matching circuit IMN (1p) for the positive path, so that the phase difference of 90° occurs between the phase of the transmit signal outputted from the input matching circuit IMN (1n) and the phase of the transmit signal outputted from the input matching circuit IMN (1p). The first-stage amplifier FAMP (1n), inter-stage matching circuit MMN (1n) and last-stage amplifier SAMP (1n) for the negative path, and the first-stage amplifier FAMP (1p), inter-stage matching circuit (1p) and last-stage amplifier SAMP (1p) for the positive path respectively transmit the transmit signals in the state in which the phase difference of 90° has occurred therebetween. Then, the phases of the transmit signals are respectively adjusted by the output matching circuit OMN (1n) for the negative path and the output matching circuit OMN (1p) for the positive path so that the phase of the transmit signal outputted from the output matching circuit OMN (1n) and the phase of the transmit signal outputted from the output matching circuit OMN (1p) become the same. Then, the transmit signals made identical in phase to each other are coupled by the power coupler WC.

According to the balance amplifier, an advantage is brought about in that since the phases of the transit signals transmitted through the two amplifying paths are shifted by 90° from each other, the output from the balance amplifier can be controlled approximately constant even though the load coupled to the output terminal of the balance amplifier fluctuates. Namely, when one of the two amplifying paths changes to high impedance due to the fluctuations in the load, the other amplifying path changes to low impedance with respect to the fluctuations in the load. Therefore, when the transmit signals transferred through the two amplifying paths are coupled, the changes in the power of the transmit signals with respect to the fluctuations in the load can complement each other. As a result, the power of the transmit signal outputted from the balance amplifier can be kept approximately constant without being affected by the fluctuations in the load. Thus, the PA module PA resistant to the fluctuations in the load can be configured by configuring the PA module PA from the balance amplifier.

Figure 4:
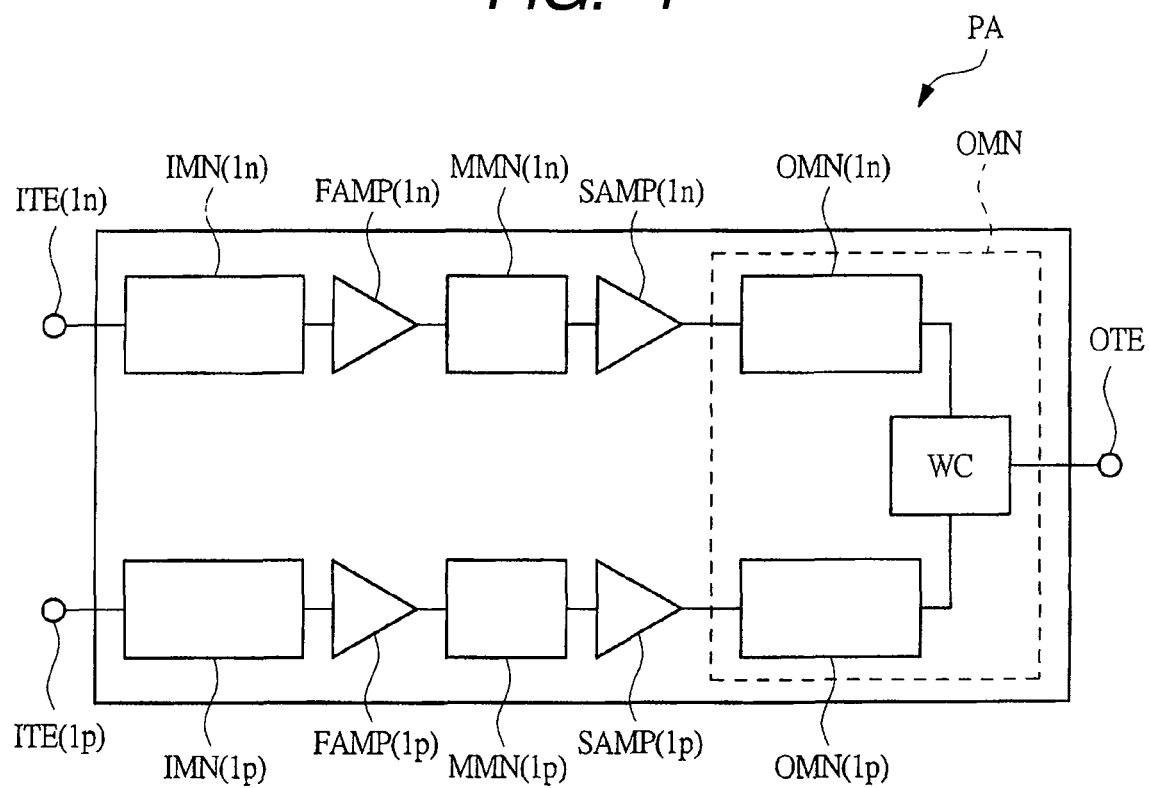
FIG. 4 is a block diagram showing another example in which a PA module comprises a balance amplifier.

A configuration of a balance amplifier capable of improving resistance to noise will further be explained. FIG. 4 is a circuit block diagram showing an example in which a PA module PA is comprised of a balance amplifier. The balance amplifier shown in FIG. 4 has an input terminal ITE (1n) and an input terminal ITE (1p). Namely, a point of difference between the balance amplifier shown in FIG. 4 and the balance amplifier shown in FIG. 3 resides in that in the balance amplifier shown in FIG. 3, the transmit signal is inputted from one input terminal ITE, whereas in the balance amplifier shown in FIG. 4, transmit signals different by 180° in phase from each other are inputted from the two input terminals ITE (1n) and ITE (1p). The balance amplifier shown in FIG. 3 and the balance amplifier shown in FIG. 4 are approximately identical in other configuration to each other.

In the case of the balance amplifier shown in FIG. 3, the transmit signal is inputted from one input terminal ITE, and the input transmit signal is divided into the transmit signal transferred through the negative path and the transmit signal transferred through the positive path by the power divider PD1. In this case, the transmit signal inputted to one input terminal ITE is placed in one phase state. Therefore, when noise occurs in the transmit signal, the same noise occurs in the transmit signal transferred through the negative path and the transmit signal transferred through the positive path. Thus, when the transmit signal transferred through the negative path and the transmit signal transferred through the positive path are coupled by the power coupler WC, the noise is also amplified.

In the case of the balance amplifier shown in FIG. 4, the input terminal ITE (1n) input to its corresponding negative path and the input terminal ITE (1p) input to its corresponding positive path are provided in several. The transmit signal inputted to the input terminal ITE (1*n*) and the transmit signal inputted to the input terminal ITE (1*p*) have a phase difference (antiphase) of 180°. Thus, when noise occurs in the transmit signals antiphase to each other, there is, for example, a case where noise of the transmit signal inputted to the input terminal ITE (1*n*) and nose of the transmit signal inputted to the input terminal ITE (1*p*) become antiphase to each other. Although the noises antiphase to each other are respectively transferred through the negative and positive paths in this case, they are eventually coupled by the power coupler WC. Since, at this time, the noise that occurs in the transmit signal transferred through the negative path, and the noise that occurs in the transmit signal transferred through the positive path become opposite in polarity, the noises of reverse polarity are cancelled out where the transmit signals are coupled by the power coupler WC. Thus, when the PA module PA is configured of the balance amplifier shown in FIG. 4, the noise that occurs upon the input of the transmit signal to the PA module PA is reduced upon the output thereof from the PA module PA. Namely, the balance amplifier shown in FIG. 4 has a characteristic excellent in noise resistance.

Thus, the first embodiment will explain an example in which the PA module PA is comprised of the balance amplifier shown in FIG. 4. The technical idea of the first embodiment is not limited the balance amplifier shown in FIG. 4, but applicable even to the balance amplifier shown in FIG. 3, for example.

<<Operation of PA module (balance amplifier)>>

The PA module PA comprised of the balance amplifier is configured in the above-described manner. Its operation will be explained below with reference to FIGS. 5 and 6.

Figure 5:
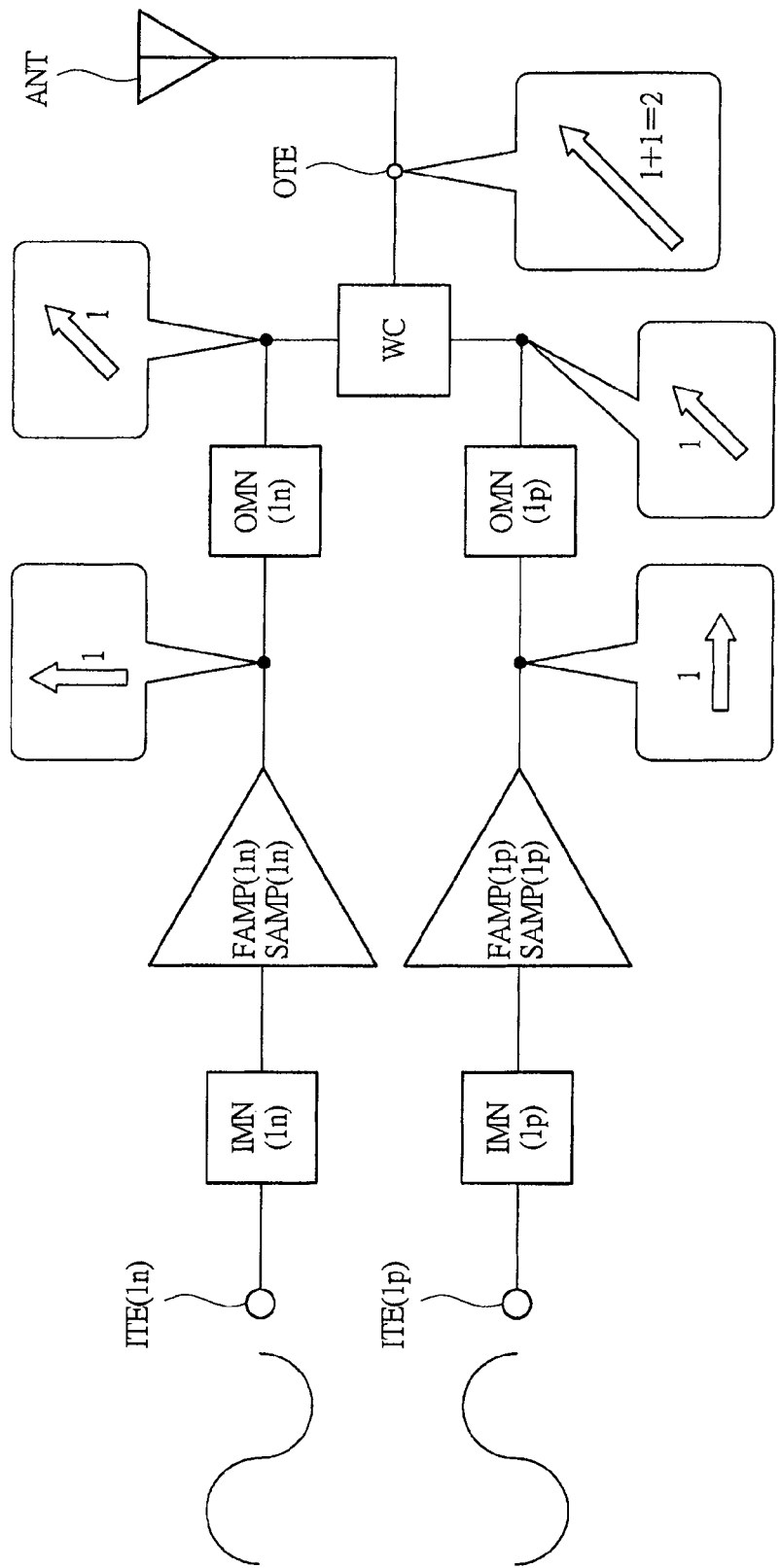
FIG. 5 is a diagram for describing an operation of a balance amplifier.

The operation of the balance amplifier where no fluctuations in load occur will first be described with reference to FIG. 5. In FIG. 5, at a negative path, a transmit signal inputted from an input terminal ITE (1*n*) is phase-adjusted to, for example, 90° by an input matching circuit IMN (1*n*) and thereafter amplified by a first-stage amplifier FAMP (1*n*) and a last-stage amplifier SAMP (1*n*). Then, the amplified transmit signal is phase-adjusted by an output matching circuit OMN (1*n*) so that the phase of the transmit signal outputted from the output matching circuit OMN (1*n*) is brought to 45°, for example.

On the other hand, a transmit signal different by 180° in phase from the transmit signal inputted to the negative path is inputted to its corresponding input terminal ITE (1*p*) at a positive path. The transmit signal input from the input terminal ITE (1*p*) is phase-adjusted to, for example, 0° by an input matching circuit IMN (1*p*) and thereafter amplified by a first-stage amplifier FAMP (1*p*) and a last-stage amplifier SAMP (1*p*). Then, the amplified transmit signal is phase-adjusted by an output matching circuit OMN (1*p*) so that the phase of the transmit signal outputted from the output matching circuit OMN (1*p*) is brought to 45°, for example.

Then, the transmit signal outputted from the output matching circuit OMN (1*n*) for the negative path and the transmit signal outputted from the output matching circuit OMN (1*p*) for the positive path are coupled by the corresponding power coupler WC from which the coupled signal is outputted through an output terminal OTE. The transmit signal outputted from the output terminal OTE is sent from an antenna ANT.

The phase of the transmit signal transferred through the negative path and the phase of the transmit signal transferred through the positive path will now be explained by paying attention to the relationship therebetween. As shown in FIG. 5, the difference between the phase of a transmit signal prior to being inputted to the input matching circuit IMN (1*n*) for the negative path, and the phase of a transmit signal prior to being inputted to the input matching circuit IMN (1*p*) for the positive path become 180°.

Next, the phase of the transmit signal after being outputted from the input matching circuit IMN (1*n*) assumes 90° at the negative path. As to the phase of the transmit signal and the magnitude of its amplitude at this time, for example, the phase thereof faces in a 90° direction and the magnitude of the amplitude becomes "1" as shown in FIG. 5. On the other hand, the phase of the transmit signal after being outputted from the input matching circuit IMN (1*p*) assumes 0° at the positive path. As to the phase of the transmit signal and the magnitude of its amplitude at this time, for example, the phase thereof faces in a 0° direction and the magnitude of the amplitude becomes "1" as shown in FIG. 5. Accordingly, the difference between the phase) (90° of the transmit signal outputted from the input matching circuit IMN (1*n*) for the negative path and the phase (0°) of the transmit signal outputted from the input matching circuit IMN (1*p*) for the positive path becomes 90°.

Subsequently, the phase of the transmit signal after being outputted from the output matching circuit OMN (1*n*) becomes 45° at the negative path. As to the phase of the transmit signal and the magnitude of its amplitude at this time, for example, the phase thereof faces in a 45° direction and the magnitude of the amplitude becomes "1" as shown in FIG. 5. On the other hand, the phase of the transmit signal after being outputted from the output matching circuit OMN (1*p*) assumes 45° at the positive path. As to the phase of the transmit signal and the magnitude of its amplitude at this time, for example, the phase thereof faces in a 45° direction and the magnitude of the amplitude becomes "1" as shown in FIG. 5. Accordingly, the difference between the phase) (45° of the transmit signal outputted from the output matching circuit OMN (1*n*) for the negative path and the phase (45°) of the transmit signal outputted from the output matching circuit OMN (1*p*) for the positive path becomes 0°.

Thus, the transmit signal outputted from the output matching circuit OMN (1*n*) for the negative path and the transmit signal outputted from the output matching circuit OMN (1*p*) for the positive path are placed 45° apart in phase and have the same phase. Therefore, when the transmit signal at the negative path and the transmit signal at the positive path are coupled by the power coupler WC, the phase of the transmit signal outputted from the power coupler WC to the output terminal OTE is 45° and the magnitude of its amplitude reaches "1"+"1"="2". This transmit signal is transmitted from the antenna ANT. The above relates to the operation of the balance amplifier where no fluctuations in load occur.

Figure 6:
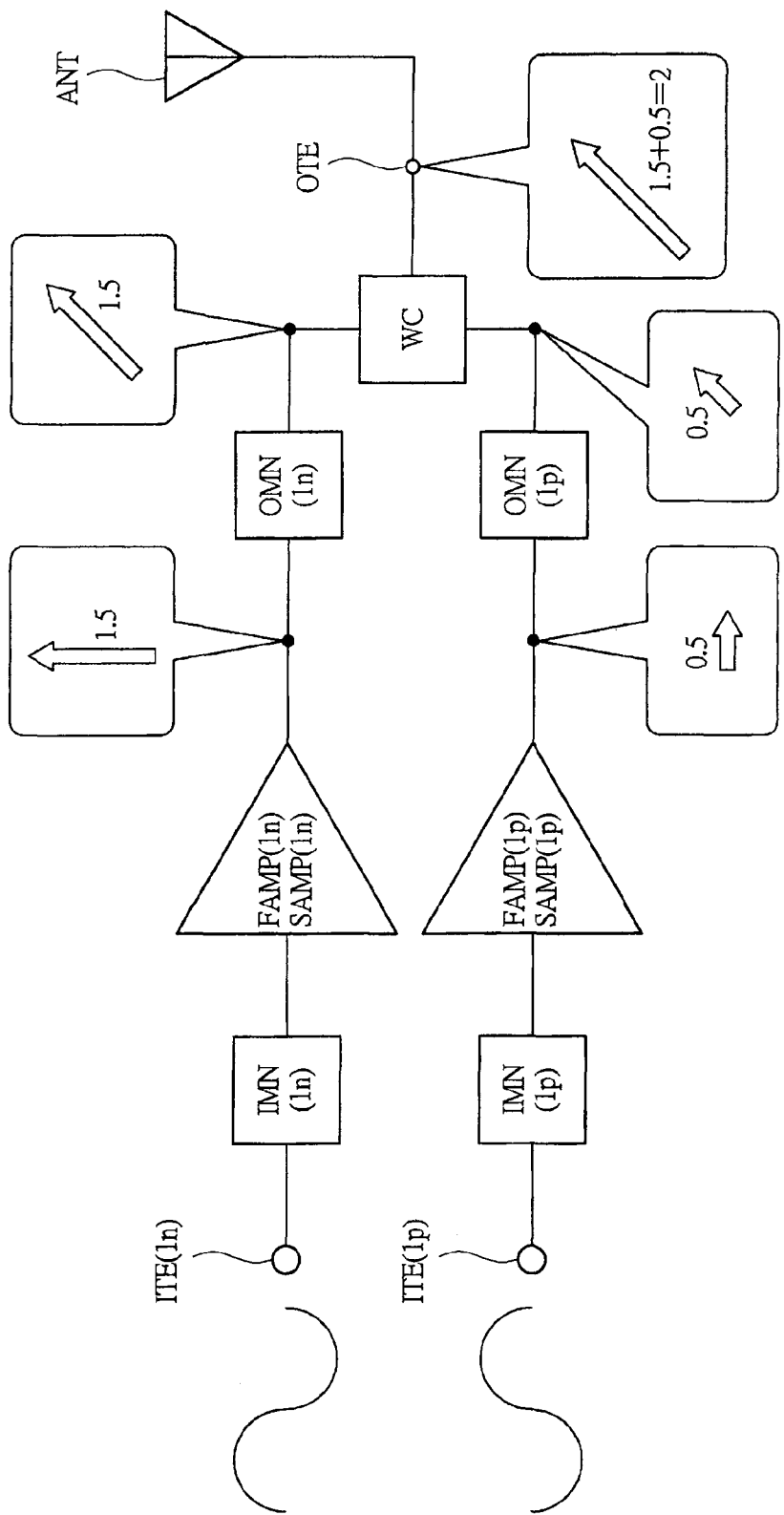
FIG. 6 is a diagram for describing another operation of the balance amplifier.

The operation of the balance amplifier where fluctuations in load occur will next be explained with reference to FIG. 6. In FIG. 6, at the negative path, a transmit signal inputted from the input terminal ITE (1*n*) is phase-adjusted to, for example, 90° by the input matching circuit IMN (1*n*) and thereafter amplified by the first-stage amplifier FAMP (1*n*) and the last-stage amplifier SAMP (1*n*). Then, the amplified transmit signal is phase-adjusted by the output matching circuit OMN (1*n*) so that the phase of the transmit signal outputted from the output matching circuit OMN (1*n*) is brought to 45°, for example.

On the other hand, a transmit signal different by 180° in phase from the transmit signal inputted to the negative path is inputted to its corresponding input terminal ITE (1*p*) at the positive path. The transmit signal input from the input terminal ITE (1*p*) is phase-adjusted to, for example, 0° by the input matching circuit IMN (1*p*) and thereafter amplified by the first-stage amplifier FAMP (1*p*) and the last-stage amplifier SAMP (1p). Then, the amplified transmit signal is phase-adjusted by the output matching circuit OMN (1p) so that the phase of the transmit signal outputted from the output matching circuit OMN (1p) is brought to 45°, for example.

Then, the transmit signal outputted from the output matching circuit OMN (1n) for the negative path and the transmit signal outputted from the output matching circuit OMN (1p) for the positive path are coupled by the corresponding power coupler WC from which the coupled signal is outputted through the output terminal OTE. The transmit signal outputted from the output terminal OTE is sent from the antenna ANT.

The phase of the transmit signal transferred through the negative path and the magnitude of its amplitude, and the phase of the transmit signal transferred through the positive path and the magnitude of its amplitude will now be explained by paying attention to the relationship therebetween. As shown in FIG. 6, the difference between the phase of a transmit signal prior to being inputted to the input matching circuit IMN (1n) for the negative path, and the phase of a transmit signal prior to being inputted to the input matching circuit IMN (1p) for the positive path become 180°.

Next, the phase of the transmit signal after being outputted from the input matching circuit IMN (1n) assumes 90° at the negative path. As to the phase of the transmit signal and the magnitude of its amplitude at this time, for example, the phase thereof faces in a 90° direction and the magnitude of the amplitude becomes "1.5" as shown in FIG. 6. When the fluctuations in load occur in this way, the amplitude of the transmit signal transferred through the negative path changes from "1" to "1.5", for example.

On the other hand, the phase of the transmit signal after being outputted from the input matching circuit IMN (1p) assumes 0° at the positive path. As to the phase of the transmit signal and the magnitude of its amplitude at this time, for example, the phase thereof faces in a 0° direction and the magnitude of the amplitude becomes "0.5" as shown in FIG. 6. When the fluctuations in load occur in this way, the amplitude of the transmit signal transferred through the positive path changes from "1" to "0.5", for example. This is because the two amplifying paths (negative and positive paths) are provided to complement changes in output power each other with respect to the fluctuations in load.

Subsequently, the phase of the transmit signal after being outputted from the output matching circuit OMN (1n) becomes 45° at the negative path. As to the phase of the transmit signal and the magnitude of its amplitude at this time, for example, the phase thereof faces in a 45° direction and the magnitude of the amplitude becomes "1.5" as shown in FIG. 6. On the other hand, the phase of the transmit signal after being outputted from the output matching circuit OMN (1p) assumes 45° at the positive path. As to the phase of the transmit signal and the magnitude of its amplitude at this time, for example, the phase thereof faces in a 45° direction and the magnitude of the amplitude becomes "0.5" as shown in FIG. 6. Accordingly, the difference between the phase (45°) of the transmit signal outputted from the output matching circuit OMN (1n) for the negative path and the phase (45°) of the transmit signal outputted from the output matching circuit OMN (1p) for the positive path becomes 0°.

Thus, the transmit signal outputted from the output matching circuit OMN (1n) for the negative path and the transmit signal outputted from the output matching circuit OMN (1p) for the positive path are both taken as 45° in phase and have the same phase. Therefore, when the transmit signal at the negative path and the transmit signal at the positive path are coupled by the power coupler WC, the phase of the transmit signal outputted from the power coupler WC to the output terminal OTE is 45° and the magnitude of its amplitude reaches "1.5"+"0.5"="2". This transmit signal is transmitted from the antenna ANT. Accordingly, the magnitude of the amplitude of the transmit signal sent from the antenna ANT becomes "2" even though fluctuations in load occur. Namely, the magnitude of the amplitude of the transmit signal transmitted from the antenna ANT does not change before and after the occurrence of the fluctuations in load. This means that in the balance amplifier, the power of the transmit signal to be transmitted can be kept constant even when the fluctuations in load occur. It is thus understood that the PA module PA resistant to the fluctuations in load can be configured by configuring the PA module PA from the balance amplifier.

<<Dual-Banding of PA Module (Balance Amplifier)>>

Various application functions as well as voice calling functions have been added to a recent cellular phone. Namely, functions other than voice calling functions such as listening to delivery music, transmission of moving pictures, data transfer and the like using a cellular phone have been added to the cellular phone. With multifunctioning of such a cellular phone, frequency bands (GSM (Global System for Mobile communication) band, PCS (Personal Communication Services) band, etc.), modulation schemes (GSM, EDGE (Enhanced Data rates for GSM Evolution), WCDMA (Wideband Code Division Multiplex Access), etc.) around the world exist in large numbers. Thus, the cellular phone needs to cope with transmit-receive signals corresponding to a plurality of different frequency bands and different modulation schemes. From this point of view, even a PA module PA that exists in the cellular phone needs to have functions for amplifying signals lying in different frequency bands respectively. It has been practised to enable transmit signals lying in different frequency bands to be amplified within one semiconductor chip that configures the PA module PA. Namely, considering where, for example, transmit signals (called low-band signal (signal lying in a first frequency band)) and high-band signal (signal lying in a second frequency band)) lying in two different frequency bands are amplified, an amplifier circuit for the low-band signal and an amplifier circuit for the high-band signal are formed in one semiconductor chip. This means that similarly, even where the PA module PA is configured from balance amplifiers, a low-band signal balance amplifier and a high-band signal balance amplifier are formed in one semiconductor chip.

Figure 7:
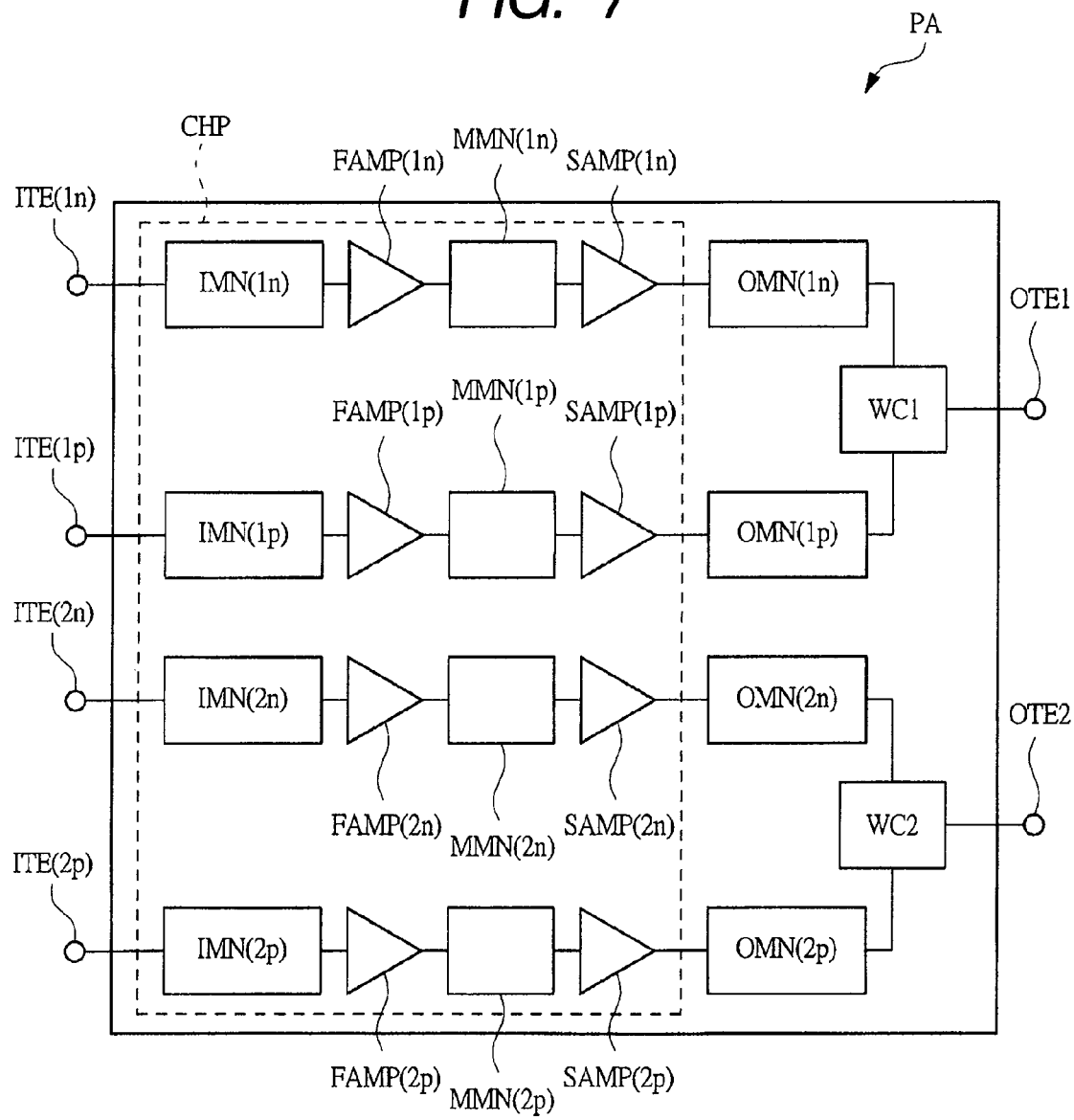
FIG. 7 is a block diagram showing a configuration example of a dual-band balance amplifier.

FIG. 7 is a block diagram of a PA module in which a low-band signal balance amplifier and a high-band signal balance amplifier are formed. A configuration of the low-band signal balance amplifier will first be explained in FIG. 7. As shown in FIG. 7, an input terminal ITE (1n) and an input terminal ITE (1p) are formed in the PA module PA. A path coupled to the input terminal ITE (1n) corresponds to a negative path for the low-band signal balance amplifier. Described specifically, an input matching circuit IMN (1n) coupled to the input terminal ITE (1n), a first-stage amplifier FAMP (1n) coupled to the input matching circuit IMN (1n) and an inter-stage matching circuit MMN (1n) coupled to the first-stage amplifier FAMP (1n) are formed in the negative path for the low-band signal balance amplifier. Further, a last-stage amplifier SAMP (1n) coupled to the inter-stage matching circuit MMN (1n) and an output matching circuit OMN (1n) coupled to the last-stage amplifier SAMP (1n) are formed in the negative path for the low-band signal balance amplifier.

Similarly, an input matching circuit IMN (1p) coupled to an input terminal ITE (1p), a first-stage amplifier FAMP (1p) coupled to the input matching circuit IMN (1p) and an inter-stage matching circuit MMN (1p) coupled to the first-stage amplifier FAMP (1*p*) are formed in a positive path for the low-band signal balance amplifier. Further, a last-stage amplifier SAMP (1*p*) coupled to the inter-stage matching circuit MMN (1*p*) and an output matching circuit OMN (1*p*) coupled to the last-stage amplifier SAMP (1*p*) are formed in the positive path for the low-band signal balance amplifier.

The output matching circuit OMN (1*n*) and the output matching circuit OMN (1*p*) are coupled to a power coupler WC1. The output of the power coupler WC1 is coupled to an output terminal OTE1. The low-band signal balance amplifier is configured in this way.

A configuration of the high-band signal balance amplifier will be explained subsequently. As shown in FIG. 7, an input terminal ITE (2*n*) and an input terminal ITE (2*p*) are formed in the PA module PA. A path coupled to the input terminal ITE (2*n*) corresponds to a negative path for the high-band signal balance amplifier. Described specifically, an input matching circuit IMN (2*n*) coupled to the input terminal ITE (2*n*), a first-stage amplifier FAMP (2*n*) coupled to the input matching circuit IMN (2*n*) and an inter-stage matching circuit MMN (2*n*) coupled to the first-stage amplifier FAMP (2*n*) are formed in the negative path for the high-band signal balance amplifier. Further, a last-stage amplifier SAMP (2*n*) coupled to the inter-stage matching circuit MMN (2*n*) and an output matching circuit OMN (2*n*) coupled to the last-stage amplifier SAMP (2*n*) are formed in the negative path for the high-band signal balance amplifier.

Similarly, an input matching circuit IMN (2*p*) coupled to an input terminal ITE (2*p*), a first-stage amplifier FAMP (2*p*) coupled to the input matching circuit IMN (2*p*) and an inter-stage matching circuit MMN (2*p*) coupled to the first-stage amplifier FAMP (2*p*) are formed in a positive path for the high-band signal balance amplifier. Further, a last-stage amplifier SAMP (2*p*) coupled to the inter-stage matching circuit MMN (2*p*) and an output matching circuit OMN (2*p*) coupled to the last-stage amplifier SAMP (2*p*) are formed in the positive path for the high-band signal balance amplifier.

The output matching circuit OMN (2*n*) and the output matching circuit OMN (2*p*) are coupled to a power coupler WC2. The output of the power coupler WC2 is coupled to an output terminal OTE2. The high-band signal balance amplifier is configured in this way.

Although the PA module PA formed with the low-band signal balance amplifier and the high-band signal balance amplifier has been explained in the above-described manner with reference to FIG. 7, those existing in an area surrounded with a broken line, of components shown in FIG. 7 are formed in a semiconductor chip CHP. At this time, the negative and positive paths for the low-band signal balance amplifier, and the negative and positive paths for the high-band signal balance amplifier are arranged side by side in parallel in FIG. 7. Since low-band signal amplifying paths (negative and positive paths) and high-band signal amplifying paths (negative and positive paths) perform signal transfer between wirings close to each other, the coupling capacitance between the wirings close to each other becomes large, so that crosstalk between the low-band and high-band signals becomes manifest as a problem. Thus, when the low-band signal balance amplifier and the high-band signal balance amplifier are formed within one small semiconductor chip, there is a need to devise a layout configuration of the low-band and high-band signal balance amplifiers with a view to suppressing the crosstalk between the low-band and high-band signals. Thus, in the first embodiment, contrivance is given to a layout arrangement of the low-band signal balance amplifier and the high-band signal balance amplifier.

<<Configuration of PA Module (Balance Amplifier) According to the First Embodiment>>

Figure 8:
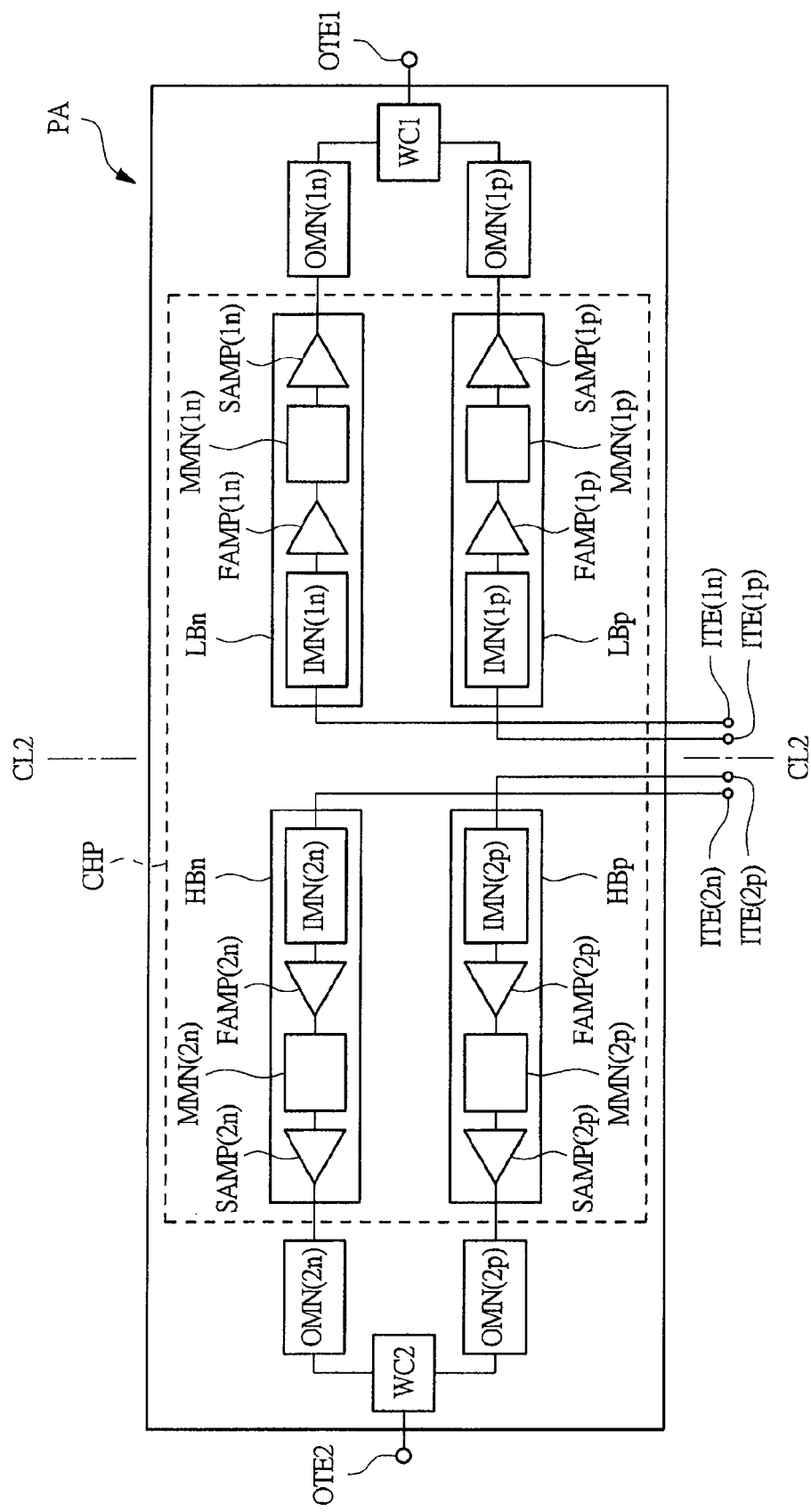
FIG. 8 is a block diagram illustrating a configuration example of a dual-band balance amplifier according to a first embodiment of the present invention.

FIG. 8 is a diagram showing a configuration of a PA module PA according to the first embodiment. In FIG. 8, the feature of the PA module PA according to the first embodiment resides in that a low-band signal balance amplifier is formed on one side with respect to a center line CL2 of the PA module PA and a high-band signal balance amplifier is formed on another side with respect to the center line CL2. The feature thereof also resides in that input terminals ITE (1*n*) and ITE (1*p*) and input terminals ITE (2*n*) and ITE (2*p*) are formed near the center line CL2. With the provision of such a configuration, transmit signals inputted from the input terminals ITE (1*n*) and ITE (1*p*) schematically take paths that travel to the right side of FIG. 8 at the low-band signal balance amplifier. On the other hand, at the high-band signal balance amplifier, transmit signals inputted from the input terminals ITE (2*n*) and ITE (2*p*) take paths that travel to the left side of FIG. 8. Thus, amplifying paths for the low-band signal balance amplifier and amplifying paths for the high-band signal balance amplifier travel in an antipodal direction. This means that the amplifying paths for the low-band signal balance amplifier and the amplifying paths for the high-band signal balance amplifier can be disposed without running parallel to one another. It is therefore possible to prevent crosstalk due to the parallel running of each amplifying path for the low-band signal balance amplifier and each amplifying path for the high-band signal balance amplifier. As a result, an improvement in the characteristic of the PA module PA equipped with the low-band signal balance amplifier and the high-band signal balance amplifier can be achieved.

A concrete configuration of the PA module PA will next be explained. As shown in FIG. 8, the low-band signal balance amplifier is formed on the right side of the center line CL2 of the PA module PA shaped in rectangular form. A configuration of the low-band signal balance amplifier will be described. As shown in FIG. 8, the input terminal ITE (1*n*) and the input terminal ITE (1*p*) are formed in the vicinity of the center line CL2 of the PA module PA. A path coupled to the input terminal ITE (1*n*) corresponds to a negative path for the low-band signal balance amplifier. An input matching circuit IMN (1*n*) coupled to the input terminal ITE (1*n*), a first-stage amplifier FAMP (1*n*) coupled to the input matching circuit IMN (1*n*) and an inter-stage matching circuit MMN (1*n*) coupled to the first-stage amplifier FAMP (1*n*) are formed in the negative path for the low-band signal balance amplifier. Further, a last-stage amplifier SAMP (1*n*) coupled to the inter-stage matching circuit MMN (1*n*) and an output matching circuit OMN (1*n*) coupled to the last-stage amplifier SAMP (1*n*) are formed in the negative path for the low-band signal balance amplifier.

Similarly, an input matching circuit IMN (1*p*) coupled to the input terminal ITE (1*p*), a first-stage amplifier FAMP (1*p*) coupled to the input matching circuit IMN (1*p*) and an inter-stage matching circuit MMN (1*p*) coupled to the first-stage amplifier FAMP (1*p*) are formed in a positive path for the low-band signal balance amplifier. Further, a last-stage amplifier SAMP (1*p*) coupled to the inter-stage matching circuit MMN (1*p*) and an output matching circuit OMN (1*p*) coupled to the last-stage amplifier SAMP (1*p*) are formed in the positive path for the low-band signal balance amplifier.

The output matching circuit OMN (1*n*) and the output matching circuit OMN (1*p*) are coupled to a power coupler WC1. The output of the power coupler WC1 is coupled to an output terminal OTE1. The low-band signal balance amplifier is configured in this way. An area surrounded with a dotted line, of components of the low-band signal balance amplifier is formed in a semiconductor chip CHP. A path formed by the input matching circuit IMN (1n), first-stage amplifier FAMP (1n), inter-stage matching circuit MMN (1n) and last-stage amplifier SAMP (1n) of the components of the low-band signal balance amplifier (amplifier for the negative path and amplifier for the positive path) formed in the semiconductor chip CHP is referred to as low-band signal negative path LBn. Similarly, a path formed by the input matching circuit IMN (1p), first-stage amplifier FAMP (1p), inter-stage matching circuit MMN (1p) and last-stage amplifier SAMP (1p) is referred to as low-band signal positive path LBp.

A configuration of the high-band signal balance amplifier will be described subsequently. As shown in FIG. 8, an input terminal ITE (2n) and an input terminal ITE (2p) are formed in the vicinity of the center line CL2 of the PA module PA. A path coupled to the input terminal ITE (2n) corresponds to a negative path for the high-band signal balance amplifier. Described concretely, an input matching circuit IMN (2n) coupled to the input terminal ITE (2n), a first-stage amplifier FAMP (2n) coupled to the input matching circuit IMN (2n) and an inter-stage matching circuit MMN (2n) coupled to the first-stage amplifier FAMP (2n) are formed in the negative path for the high-band signal balance amplifier. Further, a last-stage amplifier SAMP (2n) coupled to the inter-stage matching circuit MMN (2n) and an output matching circuit OMN (2n) coupled to the last-stage amplifier SAMP (2n) are formed in the negative path for the high-band signal balance amplifier.

Similarly, an input matching circuit IMN (2p) coupled to the input terminal ITE (2p), a first-stage amplifier FAMP (2p) coupled to the input matching circuit IMN (2p) and an inter-stage matching circuit MMN (2p) coupled to the first-stage amplifier FAMP (2p) are formed in a positive path for the low-band signal balance amplifier. Further, a last-stage amplifier SAMP (2p) coupled to the inter-stage matching circuit MMN (2p) and an output matching circuit OMN (2p) coupled to the last-stage amplifier SAMP (2p) are formed in the positive path for the low-band signal balance amplifier.

The output matching circuit OMN (2n) and the output matching circuit OMN (2p) are coupled to a power coupler WC2. The output of the power coupler WC2 is coupled to an output terminal OTE2. The high-band signal balance amplifier is configured in this way. An area surrounded with a dotted line, of components of the high-band signal balance amplifier is formed in a semiconductor chip CHP. A path formed by the input matching circuit IMN (2n), first-stage amplifier FAMP (2n), inter-stage matching circuit MMN (2n) and last-stage amplifier SAMP (2n) of the components of the high-band signal balance amplifier (amplifier for the negative path and amplifier for the positive path) formed in the semiconductor chip CHP is referred to as high-band signal negative path HBn. Similarly, a path formed by the input matching circuit IMN (2p), first-stage amplifier FAMP (2p), inter-stage matching circuit MMN (2p) and last-stage amplifier SAMP (2p) is referred to as high-band signal positive path HBp.

As described above, the low-band signal balance amplifier and the high-band balance amplifier are disposed on the opposite sides with respect to the center line CL2 in the PA module PA according to the first embodiment. Therefore, the amplifying paths for the low-band signal balance amplifier and the amplifying paths for the high-band signal balance amplifier can be disposed without running parallel to one another. As a result, it is possible to prevent crosstalk between the low-band signal balance amplifier and the high-band signal balance amplifier and achieve an improvement in the characteristic of the PA module PA.

<<Circuit Configuration of PA Module>>

A plurality of passive parts are also mounted onto the entire PA module PA in addition to the semiconductor chip CHP. These passive parts are parts that configure each balance amplifier. It is thus considered that since the characteristic of each balance amplifier can be improved by configuring the negative and positive paths of each balance amplifier uniformly, the characteristic of each balance amplifier that configure the PA module PA can be achieved by devising a layout arrangement of the passive parts. A technical idea related to a layout configuration of a plurality of passive parts mounted onto a wiring board will be explained below.

Figure 9:
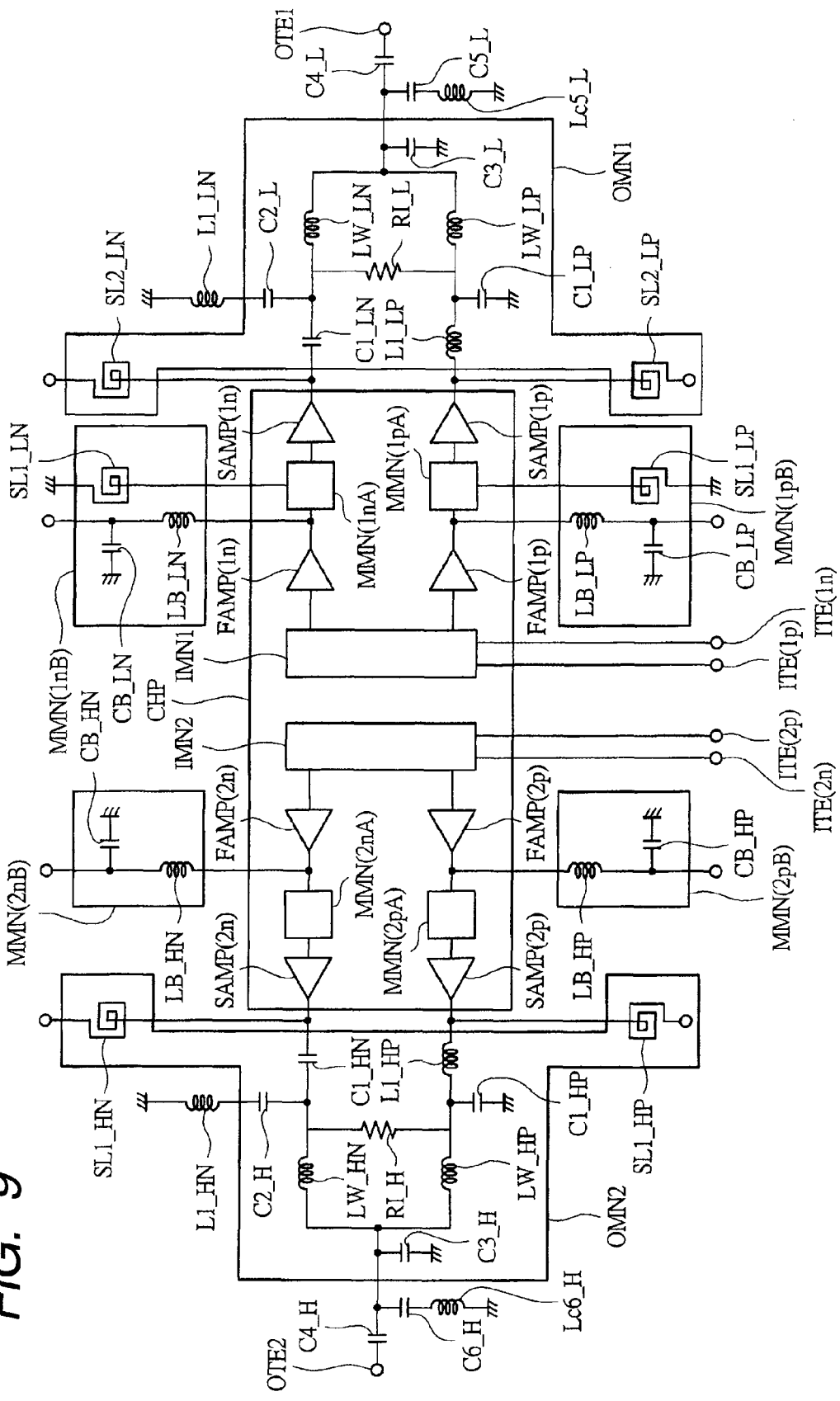
FIG. 9 is a circuit block diagram depicting a circuit configuration of a PA module according to the first embodiment.

FIG. 9 is a circuit block diagram showing a circuit configuration of the PA module PA according to the first embodiment. FIG. 9 illustrates a specific circuit configuration of passive parts mounted even onto the outside of a semiconductor chip CHP of the PA module PA. The circuit configuration of the PA module PA will be explained below using FIG. 9.

In FIG. 9, a low-band signal balance amplifier has an input terminal ITE (1n) and an input terminal ITE (1p). On the other hand, a high-band signal balance amplifier has an input terminal ITE (2n) and an input terminal ITE (2p). Namely, while the PA module PA according to the first embodiment has been formed with the low-band signal balance amplifier and the high-band signal balance amplifier, the configuration of the low-band signal balance amplifier will first be explained.

The configuration of the low-band signal balance amplifier lying within the semiconductor chip CHP will be described. In FIG. 9, an input matching circuit IMN1 electrically coupled to the input terminal ITE (1n) and the input terminal ITE (1p) is formed within the semiconductor chip CHP. Incidentally, although the input matching circuit IMN1 is described in an integrated fashion in FIG. 9, it actually comprises an input matching circuit coupled to the input terminal ITE (1n) and an input matching circuit coupled to the input terminal ITE (1p).

A low-band signal negative path will be explained. A first-stage amplifier FAMP (1n) coupled to the input matching circuit IMN1, an inter-stage matching circuit MMN (1nA) coupled to the first-stage amplifier FAMP (1n) and a last-stage amplifier SAMP (1n) coupled to the inter-stage matching circuit MMN (1nA) are provided in the low-band signal negative path. At this time, the inter-stage matching circuit MMN (1nA) is part of an inter-stage matching circuit and another inter-stage matching circuit is formed as an inter-stage matching circuit MMN (1nB) outside the semiconductor chip CHP.

A low-band signal positive path will be explained subsequently. The low-band signal positive path has a first-stage amplifier FAMP (1p) coupled to the input matching circuit IMN1, an inter-stage matching circuit MMN (1pA) coupled to the first-stage amplifier FAMP (1p) and a last-stage amplifier SAMP (1p) coupled to the inter-stage matching circuit MMN (1pA). At this time, the inter-stage matching circuit MMN (1pA) is part of an inter-stage matching circuit and another inter-stage matching circuit is formed as an inter-stage matching circuit MMN (1pB) outside the semiconductor chip CHP.

Those referred to above indicate components of the low-band signal balance amplifier, which are formed within the semiconductor chip CHP. Components of the low-band signal balance amplifier, which are formed outside the semiconductor chip CHP, will next be explained.

The low-band signal negative path will first be explained. The inter-stage matching circuit MMN (1nB) is formed in the low-band signal negative path. Described specifically, the inter-stage matching circuit MMN (1nB) comprises an inductor LB_LN coupled to the output of the first-stage amplifier FAMP (1n), and a capacitive element CB_LN coupled between the inductor LB_LN and ground. The inter-stage matching circuit MMN (1nB) also has a spiral inductor SL1_LN coupled between the inter-stage matching circuit MMN (1nA) and ground.

The low-band signal positive path will be explained subsequently. The inter-stage matching circuit MMN (1pB) is formed in the low-band signal positive path. Described specifically, the inter-stage matching circuit MMN (1pB) comprises an inductor LB_LP coupled to the output of the first-stage amplifier FAMP (1p), and a capacitive element CB_LP coupled between the inductor LB_LP and ground. Further, the inter-stage matching circuit MMN (1pB) also has a spiral inductor SL1_LP coupled between the inter-stage matching circuit MMN (1pA) and ground.

An output matching circuit OMN1 formed outside the semiconductor chip CHP will next be explained. First, the output matching circuit OMN1 has a spiral inductor SL2_LN coupled to the output of the last-stage amplifier SAMP (1n) of the low-band signal negative path. Further, the output matching circuit OMN1 has a capacitive element C1_LN coupled to the output of the last-stage amplifier SAMP (1n) of the low-band signal negative path, and a capacitive element C2_L coupled to the capacitive element C1_LN. An inductor L1_LN is formed between the capacitive element C2_L and ground although provided outside the output matching circuit OMN1.

Firstly, the output matching circuit OMN1 has a spiral inductor SL2_LP coupled to the output of the last-stage amplifier SAMP (1p) of the low-band signal positive path. Further, the output matching circuit OMN1 has an inductor L1_LP coupled to the output of the last-stage amplifier SAMP (1p) of the low-band signal positive path, and a capacitive element C1_LP coupled between the inductor L1_LP and ground.

Then, a resistive element RI_L is formed between the output of the capacitive element C1_LN and the output of the inductor L1_LP. An inductor LW_LN is coupled to the output of the capacitive element C1_LN, and an inductor LW_LP is coupled to the output of the inductor L1_LP. The output of the inductor LW_LN and the output of the inductor LW_LP are electrically coupled to each other, and a capacitive element C3_L is formed between the outputs thereof and ground. Further, the output of the inductor LW_LN and the output of the inductor LW_LP are taken as the output of the output matching circuit OMN1. At the output of the output matching circuit OMN1, a capacitive element C4_L is formed as an external element of the output matching circuit OMN1. A capacitive element C5_L and an inductor Lc5_L are coupled in series between the output of the capacitive element C4_L, and ground. Incidentally, an output terminal OTE1 is formed at the output of the capacitive element C4_L. It is understood that a plurality of passive parts of the components of the low-band signal balance amplifier are formed outside the semiconductor chip CHP in the above-descried manner.

A configuration of the high-band balance amplifier will next be explained. The configuration of the high-band signal balance amplifier lying within the semiconductor chip CHP will first be described. In FIG. 9, an input matching circuit IMN2 electrically coupled to the input terminal ITE (2n) and the input terminal ITE (2p) is formed within the semiconductor chip CHP. Incidentally, although the input matching circuit IMN2 is described in an integrated fashion in FIG. 9, it actually comprises an input matching circuit coupled to the input terminal ITE (2n) and an input matching circuit coupled to the input terminal ITE (2p).

A high-band signal negative path will be explained. A first-stage amplifier FAMP (2n) coupled to the input matching circuit IMN2, an inter-stage matching circuit MMN (2nA) coupled to the first-stage amplifier FAMP (2n) and a last-stage amplifier SAMP (2n) coupled to the inter-stage matching circuit MMN (2nA) are provided in the high-band signal negative path. At this time, the inter-stage matching circuit MMN (2nA) is part of an inter-stage matching circuit and another inter-stage matching circuit is formed as an inter-stage matching circuit MMN (2nB) outside the semiconductor chip CHP.

A high-band signal positive path will be explained subsequently. The high-band signal positive path has a first-stage amplifier FAMP (2p) coupled to the input matching circuit IMN2, an inter-stage matching circuit MMN (2pA) coupled to the first-stage amplifier FAMP (2p) and a last-stage amplifier SAMP (2p) coupled to the inter-stage matching circuit MMN (2pA). At this time, the inter-stage matching circuit MMN (2pA) is part of an inter-stage matching circuit and another inter-stage matching circuit is formed as an inter-stage matching circuit MMN (2pB) outside the semiconductor chip CHP.

Those referred to above indicate components of the high-band signal balance amplifier, which are formed within the semiconductor chip CHP. Components of the high-band signal balance amplifier, which are formed outside the semiconductor chip CHP, will next be explained.

The high-band signal negative path will first be explained. The inter-stage matching circuit MMN (2nB) is formed in the high-band signal negative path. Described specifically, the inter-stage matching circuit MMN (2nB) comprises an inductor LB_HN coupled to the output of the first-stage amplifier FAMP (2n), and a capacitive element CB_HN coupled between the inductor LB_HN and ground.

The high-band signal positive path will be explained subsequently. The inter-stage matching circuit MMN (2pB) is formed in the high-band signal positive path. Described specifically, the inter-stage matching circuit MMN (2pB) comprises an inductor LB_HP coupled to the output of the first-stage amplifier FAMP (2p), and a capacitive element CB_HP coupled between the inductor LB_HP and ground.

An output matching circuit OMN2 formed outside the semiconductor chip CHP will next be explained. First, the output matching circuit OMN2 has a spiral inductor SL1_HN coupled to the output of the last-stage amplifier SAMP (2n) of the high-band signal negative path. Further, the output matching circuit OMN2 has a capacitive element C1_HN coupled to the output of the last-stage amplifier SAMP (2n) of the high-band signal negative path, and a capacitive element C2_H coupled to the capacitive element C1_HN. An inductor L1_HN is formed between the capacitive element C2_H and ground although provided outside the output matching circuit OMN2.

The output matching circuit OMN2 has a spiral inductor SL1_HP coupled to the output of the last-stage amplifier SAMP (2p) of the high-band signal positive path. Further, the output matching circuit OMN2 has an inductor L1_HP coupled to the output of the last-stage amplifier SAMP (2p) of the high-band signal positive path, and a capacitive element C1_HP coupled between the inductor L1_HP and ground.

Then, a resistive element RI_H is formed between the output of the capacitive element C1_HN and the output of the inductor L1_HP. An inductor LW_HN is coupled to the output of the capacitive element C1_HN, and an inductor LW_HP is coupled to the output of the inductor L1_HP. The output of the inductor LW_HN and the output of the inductor LW_HP are electrically coupled to each other, and a capacitive element C3_H is formed between the outputs thereof and ground. Further, the output of the inductor LW_HN and the output of the inductor LW_HP are taken as the output of the output matching circuit OMN2. At the output of the output matching circuit OMN2, a capacitive element C4_H is formed as an external element of the output matching circuit OMN2. A capacitive element C6_H and an inductor Lc6_H are coupled in series between the output of the capacitive element C4_H and ground. Incidentally, an output terminal OTE2 is formed at the output of the capacitive element C4_H. It is understood that a plurality of passive parts of the components of the high-band signal balance amplifier are formed outside the semiconductor chip CHP in the above-descried manner.

<<Mounting q Configuration of PA Module (First Feature Point)>>

Figure 10:
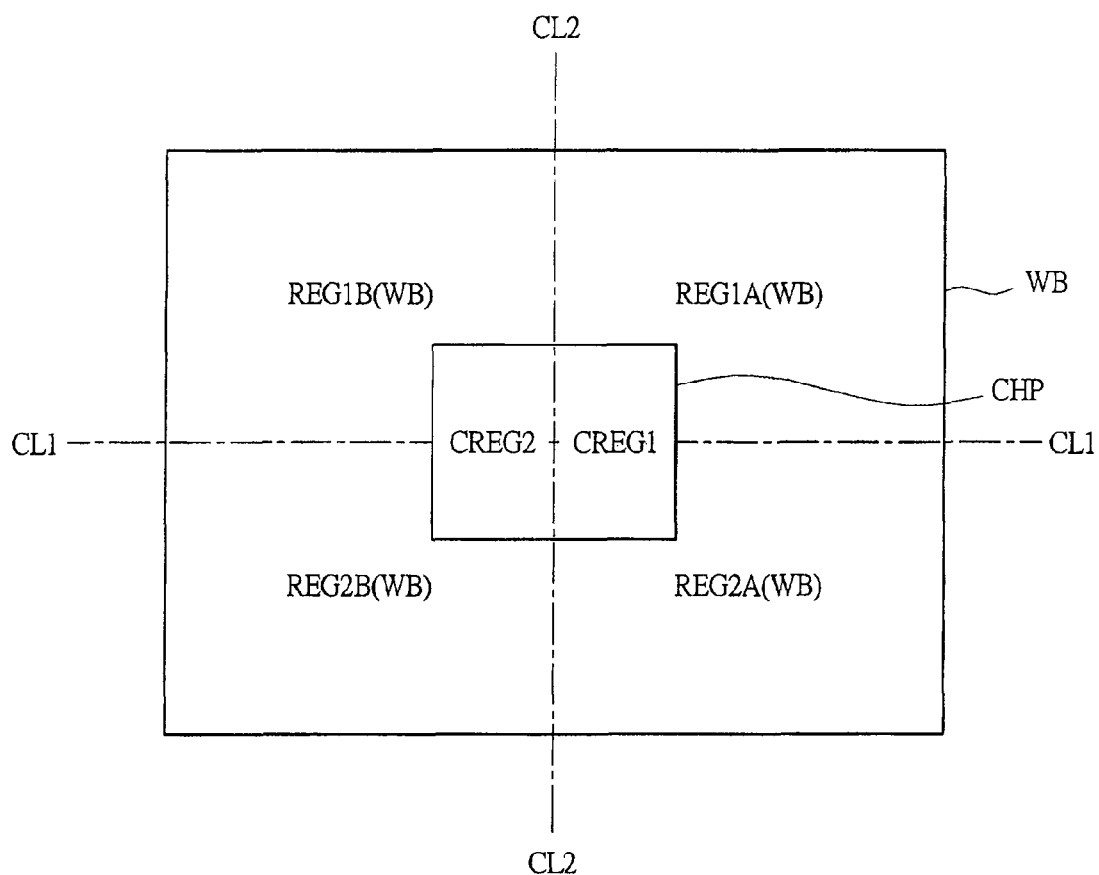
FIG. 10 is a diagram for defining respective regions of a wiring board and respective regions of a semiconductor chip.

The PA module according to the first embodiment takes a circuit configuration as described above. A mounting configuration of the PA module corresponding to the circuit configuration will be explained below. Prior to the description of the mounting configuration of the PA module, the definition of respective regions of a wiring board WB and respective regions of a semiconductor chip CHP will be explained. FIG. 10 is a diagram showing the respective regions of the wiring board WB and the respective regions of the semiconductor chip CHP. In FIG. 10, the center lines of the semiconductor chip CHP, which are orthogonal to each other, are assumed to be a center line CL2 and a center line CL1. At this time, the center of the semiconductor chip CHP is disposed so as to be provided at a point where the center lines CL2 and CL1 intersect. The semiconductor chip CHP may preferably be disposed in the center of the wiring board WB. In this case, it can also be said that the center lines CL2 and CL1 that pass through the center of the semiconductor chip CHP correspond to the center lines of the wiring board WB. Here, the regions divided by the center line CL2, of the regions of the semiconductor chip CHP are defined as chip divided regions. In FIG. 10 at this time, the region lying on the right side as viewed from the center line CL2 is called a chip divided region CREG1, and the region lying on the left side as viewed from the center line CL2 is called a chip divided region CREG2. The definition of the divided regions on the wiring board WB will be explained subsequently. As shown in FIG. 10, the region that configures the wiring board WB is divided into four regions by the center lines CL2 and CL1. The region lying on the right side as viewed from the center line CL2 and on the upper side as viewed from the center line CL1 is called a region REG1A (WB). The region lying on the left side as viewed from the center line CL2 and on the upper side as viewed from the center line CL1 is called a region REG1B (WB). On the other hand, the region lying on the right side as viewed from the center line CL2 and on the lower side as viewed from the center line CL1 is called a region REG2A (WB). The region lying on the left side as viewed from the center line CL2 and on the lower side as viewed from the center line CL1 is called a region REG2B (WB).

Figure 11:
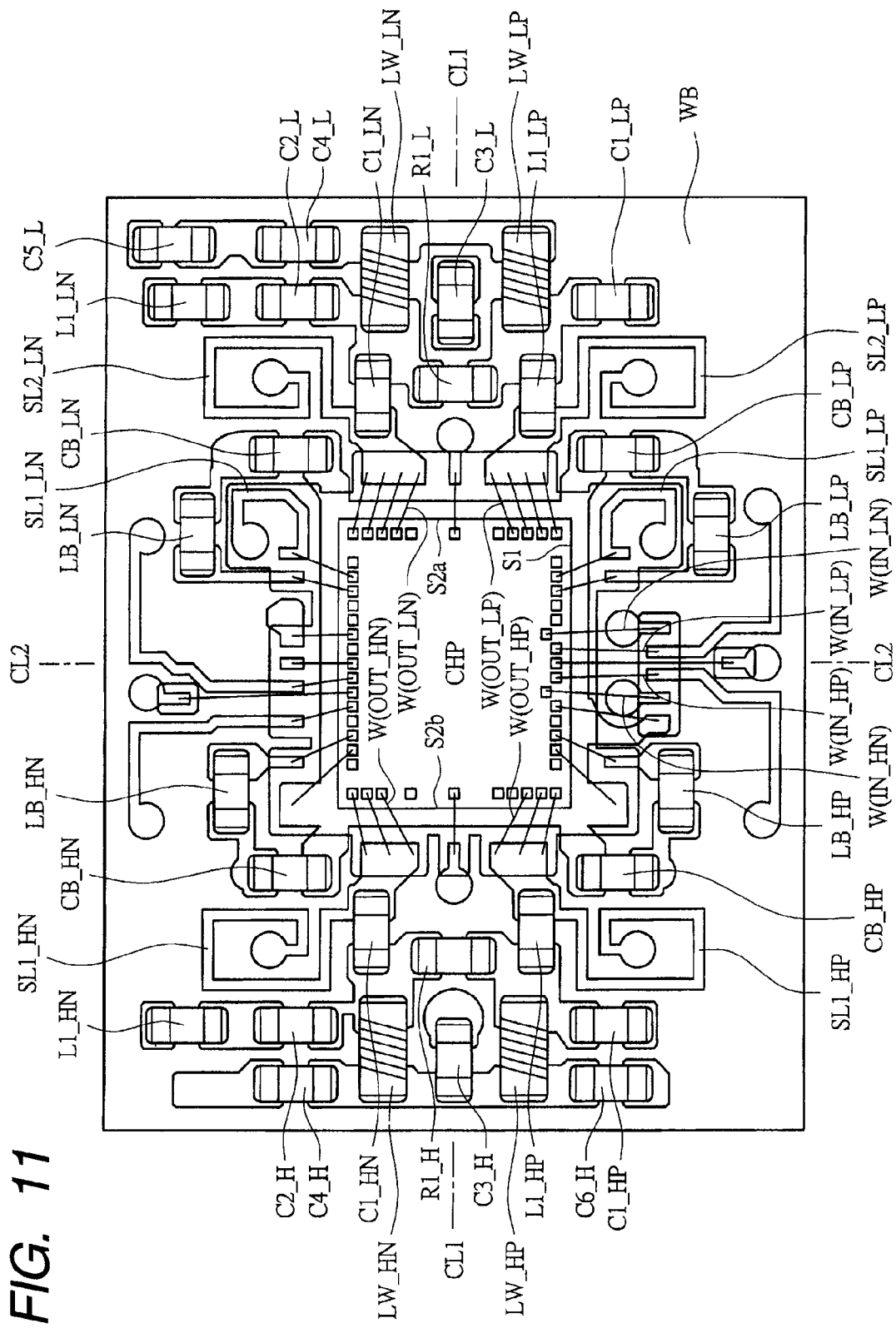
FIG. 11 is a diagram showing a mounting configuration of the PA module according to the first embodiment.

The first feature point of the first embodiment will be explained on the premise of such a configuration. The first feature point of the present embodiment resides in the mounting configuration of the PA module. FIG. 11 is a diagram showing the mounting configuration of the PA module according to the first embodiment. In FIG. 11, the PA module PA according to the first embodiment has a semiconductor chip CHP and a plurality of passive parts provided over a wiring board WB. The semiconductor chip CHP is disposed in the center of the wiring board WB.

Next, the passive parts are mounted onto the wiring board WB. Described concretely, the passive parts used as part of components for a low-band signal balance amplifier are mounted in the regions (region REG1A (WB) and region REG2A (WB)) lying on the right side relative to the center line CL2 of the semiconductor chip CHP. The passive parts used as part of components for a high-band signal balance amplifier are mounted in the regions (region REG1B (WB) and region REG2B (WB)) lying on the left side relative to the center line CL2 of the wiring board WB.

A layout arrangement of the passive parts for the low-band signal balance amplifier formed in the regions (region REG1A (WB) and region REG2A (WB)) lying on the right side relative to the center line CL2 will first be explained. The first feature point of the first embodiment resides in that each passive part (first passive part) disposed in a low-band signal negative path and each passive part (second passive part) disposed in a low-band signal positive path are disposed on the opposite sides relative to the center line CL1 of the semiconductor chip CHP. Namely, the passive parts disposed in the low-band signal negative path are disposed in the region REG1A (WB). The passive parts disposed in the low-band signal positive path are disposed in the region REG2A (WB). Namely, the passive parts disposed in the low-band signal negative path and the passive parts disposed in the low-band signal positive path are respectively disposed in the regions REG1A (WB) and REG2A (WB) separately from each other. As these passive parts, may be mentioned, for example, those comprised of chip parts and those comprised of parts like spiral inductors.

More desirably, the passive parts disposed in the low-band signal negative path and the passive parts disposed in the low-band signal positive path may be disposed symmetrically with respect to the center line CL1 of the semiconductor chip CHP. Particularly, as one example in which they are disposed symmetrically, they can be mirror symmetrically disposed relative to the center line of the semiconductor chip CHP. The symmetry referred to here mainly indicates line symmetry. If it shown in another expression, it can be said that they are disposed on the sides opposite to each other relative to the center line CL1 of the semiconductor chip CHP, and the distances from the center line CL1 of the semiconductor chip CHP to the positions of the respective passive parts become equal to one another.

Further, the symmetry described in the first embodiment also contains where it is lower than the line symmetry in symmetry property. Namely, when the symmetry is assumed to be line symmetry, it is necessary that at each pair of target passive parts, all of the passive parts become symmetric. The symmetry described in the first embodiment is not required so much. If, for example, the distances to the center points (or centers of gravity) of a pair of target passive parts are equal to each other as viewed from at least the center line CL1 of the semiconductor chip CHP, they are assumed to be contained in the symmetry described in the first embodiment.

Further, the first embodiment also includes where the respective one passive parts are disposed symmetrically. Namely, symmetry is given even to the case where one passive part is disposed on the center line CL1 of the semiconductor chip CHP, and each part disposed on the upper side of the center line CL1 and each part disposed on the lower side of the center line CL1 become equal. Further, even though each part disposed on the upper side of the center line CL1 and each part disposed on the lower side of the center line CL1 are unequal, the existence of the center point (or center of gravity) of one passive part disposed on the center line CL1 on the center line CL1 is also included in the concept of "symmetry" in the first embodiment.

The symmetry between the low-band signal negative path and the low-band signal positive path is enhanced in the above-described manner. As a result, a loss in matching due to the difference between the low-band signal negative path and the low-band signal positive path can be enough reduced, and the characteristic of the low-band signal balance amplifier can be improved.

The layout of the passive parts that configure the low-band signal balance amplifier will be explained concretely below. First, an inter-stage matching circuit MMM (1nB) that exists in the low-band signal negative path, and an inter-stage matching circuit MMN (1pB) that exists in the low-band signal positive path are disposed so as to be symmetric with respect to the center line CL1 of the wiring board WB. Described in detail, a capacitive element CB_LN lying in the inter-stage matching circuit MMN (1nB) and a capacitive element CB_LP lying in the inter-stage matching circuit MMN (1pB) are respectively placed in positions where they are symmetric with respect to each other. Further, an inductor LB_LN lying in the inter-stage matching circuit MMN (1nB) and an inductor LB_LP lying in the inter-stage matching circuit MMN (1pB) are respectively placed in positions where they are symmetric with respect to each other. These passive parts are comprised of chip parts, for example. Further, a spiral inductor SL1_LN lying in the inter-stage matching circuit MMN (1nB) and a spiral inductor SL1_LP lying in the inter-stage matching circuit MMN (1pB) are disposed so as to be symmetric with respect to the center line CL1 of the semiconductor chip. Described concretely, the spiral inductor SL1_LN and the spiral inductor SL1_LP are laid out so as to be mirror-symmetric with respect to each other. Namely, a wiring for the spiral inductor SL1_LN is formed along a clockwise direction, whereas a wiring for the spiral inductor SL1_LP is formed along a counterclockwise direction.

Subsequently, an output matching circuit OMN1 is disposed so as to be symmetric with respect to the center line CL1 of the wiring board WB. Described specifically, a resistive element RI_L and a capacitive element C3_L that configure the output matching circuit OMN1 are respectively disposed on the center line CL1. Further, a capacitive element C1_LN and an inductor L1_LP are respectively placed in positions where they are symmetric with respect to the center line CL1. An inductor LW_LN and an inductor LW_LP are also respectively placed in positions where they are symmetric with respect to the center line CL1. A capacitive element C2_L and a capacitive element C1_LP are also respectively placed in positions where they are symmetric with respect to the center line CL1. Further, a spiral inductor SL2_LN and a spiral inductor SL2_LP are disposed so as to be symmetric with respect to the center line CL1 of the semiconductor chip. Described concretely, the spiral inductor SL2_LN and the spiral inductor SL2_LP are disposed so as to be mirror-symmetric with respect to each other. In other words, a wiring for the spiral inductor SL2_LN is formed along the clockwise direction, whereas a wiring for the spiral inductor SL2_LP is formed along the counterclockwise direction.

At the low-band signal balance amplifier as described above, the inter-stage matching circuit MMN (1nB) and the inter-stage matching circuit MMN (1pB) are respectively placed in the positions where they are symmetric with respect to the center line CL1 of the wiring board WB. Further, the output matching circuit OMN1 itself is also disposed so as to be symmetric with respect to the center line CL1.

Incidentally, since the inductor L1_LN becomes an asymmetric part that exists only in the low-band signal negative path, it does not take on a symmetric layout. Further, since a capacitive element C5_L is of a passive part that functions as a harmonic trap filter and a passive part that has less influence on the matching of a transmit signal, it does not take on a symmetric layout. Since a capacitive element C4_L is of a DC cut capacitance that cuts a dc component of an amplifying path and only one exists, it does not take on a symmetric layout.

Thus, in the first embodiment, the symmetry between the low-band signal negative path and the low-band signal positive path is enhanced. As a result, a loss in matching due to the difference between the low-band signal negative path and the low-band signal positive path can be enough reduced, and the characteristic of the low-band signal balance amplifier can be improved.

A layout arrangement of the passive parts for the high-band signal balance amplifier, which have been formed on the left side relative to the center line CL2, will next be explained. In the first embodiment, the passive parts disposed in their corresponding high-band signal negative path, and the passive parts disposed in their corresponding high-band signal positive path are also disposed on the opposite sides relative to the center line CL1 of the semiconductor chip CHP. Described concretely, the passive parts disposed in the high-band signal negative path are disposed in the region REG1B (WB). The passive parts disposed in the high-band signal positive path are disposed in the region REG2B (WB). Namely, the passive parts disposed in the high-band signal negative path and the passive parts disposed in the high-band signal positive path are respectively disposed in the regions REG1B (WB) and REG2B (WB) separately from one another.

The first feature point of the first embodiment resides in that the passive parts disposed in the high-band negative path and the passive parts disposed in the high-band signal positive path are respectively placed in positions where they are symmetric with respect to the center line CL1 of the semiconductor chip CHP. Thus, the symmetry between the high-band signal negative path and the high-band signal positive path is enhanced. As a result, a loss in matching due to the difference between the high-band signal negative path and the high-band signal positive path can be enough reduced, and the characteristic of the high-band signal balance amplifier can be improved.

The layout of the passive parts that configure the high-band signal balance amplifier will be explained concretely below. First, an inter-stage matching circuit MMN (2nB) that exists in the high-band signal negative path, and an inter-stage matching circuit MMN (2pB) that exists in the high-band signal positive path are disposed so as to be symmetric with respect to the center line CL1 of the semiconductor chip CHP. Described in detail, a capacitive element CB_HN lying in the inter-stage matching circuit MMN (2nB) and a capacitive element CB_HP lying in the inter-stage matching circuit MMN (2pB) are respectively placed in positions where they are symmetric with respect to each other. Further, an inductor LB_HN lying in the inter-stage matching circuit MMN (2nB) and an inductor LB_HP lying in the inter-stage matching circuit MMN (2pB) are respectively placed in positions where they are symmetric with respect to each other.

Subsequently, an output matching circuit OMN2 is disposed so as to be symmetric with respect to the center line CL1 of the semiconductor chip CHP. Described specifically, a resistive element RI_H and a capacitive element C3_H that configure the output matching circuit OMN2 are respectively disposed on the center line CL1. Further, a capacitive element C1_HN and an inductor L1_HP are respectively placed in positions where they are symmetric with respect to the center line CL1. An inductor LW_HN and an inductor LW_HP are also respectively placed in positions where they are symmetric with respect to the center line CL1. A capacitive element C2_H and a capacitive element C1_HP are also respectively placed in positions where they are symmetric with respect to the center line CL1. Further, a spiral inductor SL1_HN and a spiral inductor SL1_HP are disposed so as to be symmetric with respect to the center line CL1 of the semiconductor chip. Described concretely, the spiral inductor SL1_HN and the spiral inductor SL1_HP are disposed so as to be mirror-symmetric with respect to each other. In other words, a wiring for the spiral inductor SL1_HN is formed along the clockwise direction, whereas a wiring for the spiral inductor SL1_HP is formed along the counterclockwise direction.

At the high-band signal balance amplifier as described above, the inter-stage matching circuit MMN (2nB) and the inter-stage matching circuit MMN (2pB) are respectively placed in the positions where they are symmetric with respect to the center line CL1 of the semiconductor chip CHP. Further, the output matching circuit OMN2 itself is also disposed so as to be symmetric with respect to the center line CL1.

Incidentally, since the inductor L1_HN becomes an asymmetric part that exists only in the high-band signal negative path, it does not take on a symmetric layout. Further, since a capacitive element C6_H is of a passive part that functions as a harmonic trap filter and a passive part that has less influence on the matching of a transmit signal, it does not take on a symmetric layout. Since a capacitive element C4_H is of a DC cut capacitance that cuts a dc component of an amplifying path and only one exists, it does not take on a symmetric layout.

Thus, in the first embodiment, the symmetry between the high-band signal negative path and the high-band signal positive path is enhanced. As a result, a loss in matching due to the difference between the high-band signal negative path and the high-band signal positive path can be enough reduced, and the characteristic of the high-band signal balance amplifier can be improved.

<<Mounting Configuration of PA Module (Second Feature Point)>>

A second feature point of the first embodiment will next be explained. In FIG. 11, the semiconductor chip CHP is shaped in rectangular form and has a first side S1 that extends in a first direction and a pair of second sides S2a and S2b that extend in a second direction orthogonal to the first direction. Wirings are coupled to such a semiconductor chip CHP. A transmit signal (pre-amplification input signal) is inputted to the inside of the semiconductor chip CHP through each of the wirings. The wirings are formed in a plural manner. They include a wiring W (IN_LN) for supplying an input signal to the low-band signal negative path and a wiring W (IN_LP) for supplying an input signal to the low-band signal positive path. Further, the wirings coupled to the semiconductor chip CHP include a wiring W (IN_HN) for supplying an input signal to the high-band signal negative path and a wiring W (IN_HP) for supplying an input signal to the high-band signal positive path. The wiring W (IN_LN), wiring W (IN_LP), wiring W (IN_HN) and wiring W (IN_HP) are formed so as to straddle the first side S1 of the semiconductor chip CHP.

On the other hand, a wiring W (OUT_LN), a wiring W (OUT_LP), a wiring W (OUT_HN) and a wiring (OUT_HP) are coupled to the semiconductor chip CHP. Transmit signals (post-amplification output signals) are outputted from the wiring W (OUT_LN), wiring W (OUT_LP), wiring W (OUT_HN) and wiring (OUT_HP) to the outside of the semiconductor chip CHP. The wiring W (OUT_LN) and wiring W (OUT_LP) are formed so as to straddle the second side S2a of the semiconductor chip CHP. The wiring W (OUT_HN) and wiring W (OUT_HP) are formed so as to straddle the second side S2b of the semiconductor chip CHP.

Thus, the wirings W (IN_LN) to W (IN_HP) and the wirings W (OUT_LN) to W (OUT_HP) are disposed in the directions in which they intersect one another. This is the second feature point of the first embodiment. Namely, as shown in FIG. 11, the wirings W (IN_LN) to W (IN_HP) and the wirings W (OUT_LN) to W (OUT_HP) are formed in the directions in which they intersect one another, thereby making it possible to suppress crosstalk between the input signals flowing through the wirings W (IN_LN) to W (1N HP) and the output signals flowing through the wirings W (OUT_LN) to W (OUT_HP).

<<Mounting Configuration of PA Module (Third Feature Point)>>

While the PA module according to the first embodiment is comprised of the semiconductor chip CHP and the passive parts mounted over the wiring board WB, the wiring board WB has a multilayered wiring structure. Namely, the wiring board WB is formed with a plurality of wiring layers over a multilayer. At this time, the symmetry between the passive parts disposed over the wiring board WB is enhanced so that the symmetry between conductor patterns that form the wiring layers of the wiring board WB can also be enhanced. Namely, the third feature point is that the first embodiment can enhance not only the symmetry between the passive parts disposed overt the wiring board WB but also the symmetry between the conductor patterns that form the multilayer wiring layer of the wiring board WB. It is thus possible to achieve a further improvement in the characteristic of the balance amplifier.

Figure 12:
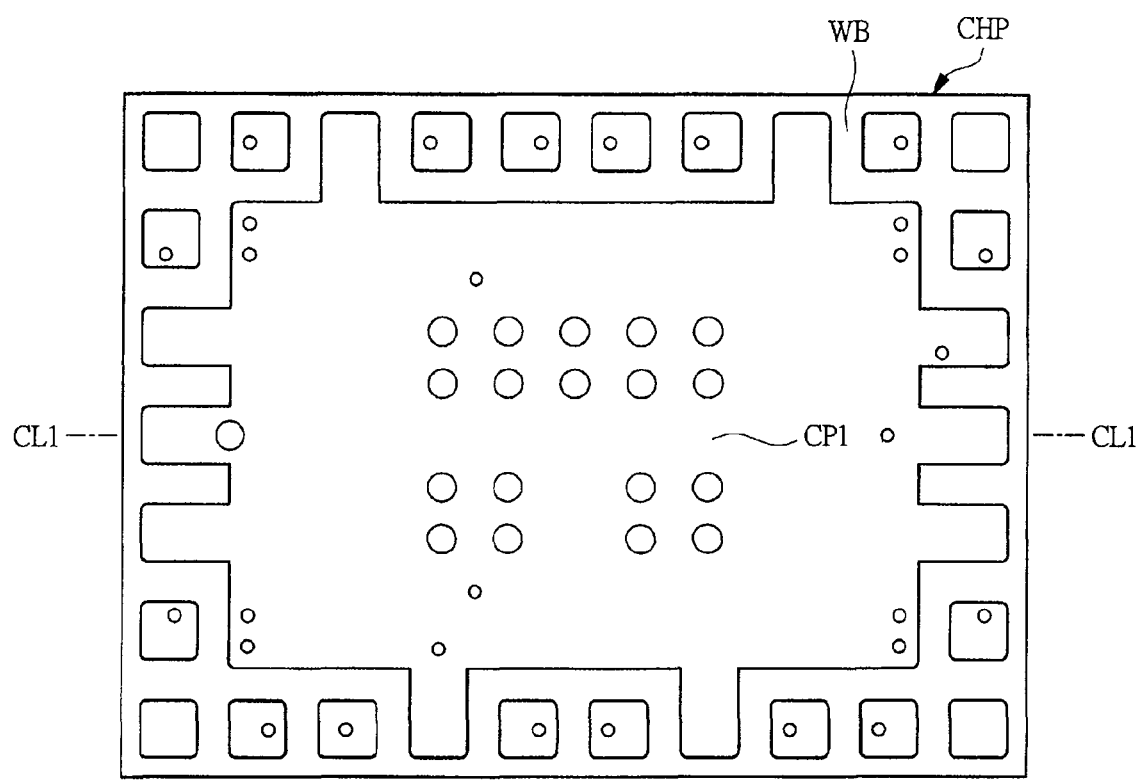
FIG. 12 is a diagram illustrating a conductor pattern formed in one given layer of a multilayer wiring layer formed in a wiring board in the first embodiment.

FIG. 12 concretely shows a conductor pattern CP1 of one layer that exists in a multilayer wiring layer of a wiring board WB. The conductor pattern CP1 is enhanced in symmetry with respect to a center line CL1. Namely, as shown in FIG. 12, the conductor pattern CP1 is enhanced in symmetry although not perfectly be symmetric with respect to the center line CL1. Thus, in the first embodiment, it is desirable to enhance the symmetry of layers lying inside the wiring board WB as well as a surface layer of the wiring board WB equipped with passive parts. Consequently, a further improvement in the characteristic of a balance amplifier can be achieved.

While the PA module PA according to the first embodiment makes use of the wiring board WB having the multilayered wiring structure as described above, the PA module PA enhances the symmetry between the passive parts disposed over the wiring board WB and also enhances the symmetry of the conductor pattern CP1 of each wiring layer. Therefore, a loss in matching due to the difference between the negative path for the balance amplifier and the positive path for the balance amplifier can be enough reduced, and the characteristic of the balance amplifier can be improved.

Second Embodiment

<<Layout Configuration within Semiconductor Chip (Fourth and Fifth Feature Points)>>

Although the first embodiment has explained the example in which the improvement in the characteristic of the balance amplifier is achieved by enhancing the symmetry between the passive parts mounted onto the wiring board WB, the present embodiment will explain an example in which a layout configuration lying within a semiconductor chip CHP is devised.

As shown in FIG. 8, the most part of the components of the low-band signal balance amplifier and the most part of the components of the high-band signal balance amplifier are formed within the semiconductor chip CHP. Accordingly, the layout thereof within the semiconductor chip CHP becomes important. A layout configuration example in which a low-band signal balance amplifier and a high-band signal balance amplifier are disposed on the sides opposite relative to a center line CL2 within a semiconductor chip CHP will be explained below.

Figure 13:
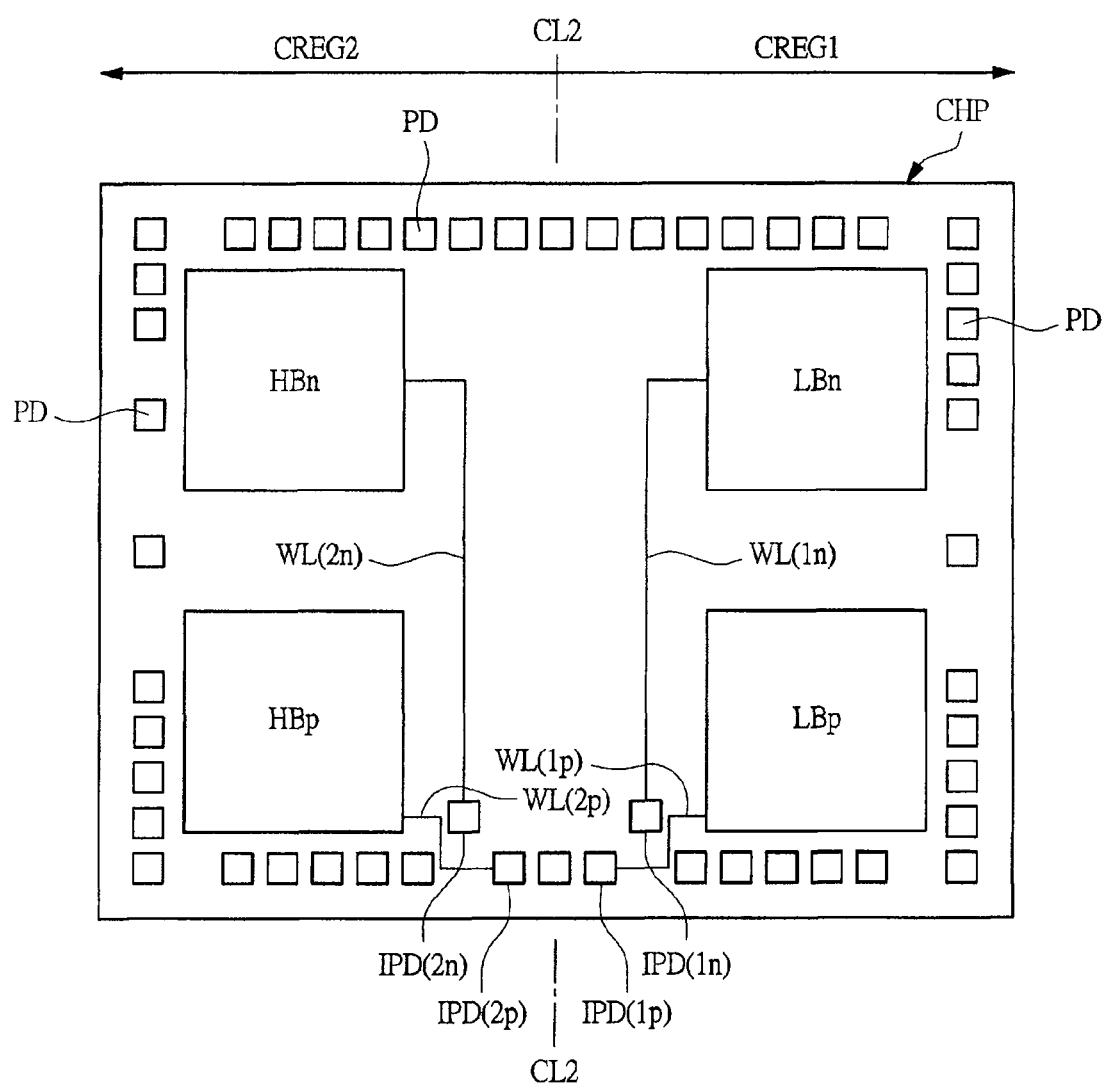
FIG. 13 is a diagram showing a layout configuration of a semiconductor chip according to a second embodiment.

FIG. 13 is a diagram showing a layout configuration within a semiconductor chip CHP. As shown in FIG. 13, the semiconductor chip CHP is shaped in rectangular form. A plurality of pads PD are formed along an outer peripheral portion of the semiconductor chip CHP. Input pads for inputting transmit signals are contained in the pads PD. Described concretely, the input pads may include an input pad IPD (1n) coupled to a low-band signal negative path LBn and an input pad IPD (1p) coupled to a low-band signal positive path LBp. Further, as the input pads may be mentioned an input pad IPD (2n) coupled to a high-band signal negative path HBn and an input pad IPD (2p) coupled to a high-band signal positive path HBp.

The low-band signal balance amplifier and the high-band signal balance amplifier are formed inside the semiconductor chip CHP. Described concretely, as shown in FIG. 13, the low-band signal balance amplifier and the high-band signal balance amplifier are formed on the opposite sides relative to the center line CL2 of the semiconductor chip CHP. Namely, the low-band signal balance amplifier is formed in a chip divided area CREG1 of the semiconductor chip CHP, and the high-band signal balance amplifier is formed in a chip divided region CREG2 of the semiconductor chip CHP. As shown in FIG. 13, for example, the low-band signal negative path LBn and the low-band signal positive path LBp are formed in the right region (chip divided region CREG1) of the center line CL2, whereas the high-band negative path HBn and the high-band signal positive path HBp are formed in the left region (chip divided region CREG2) of the center line CL2. The low-band signal negative path LBn and the input pad IPD (1n) are coupled to each other by a wiring WL (1n). The low-band signal positive path LBp and the input pad IPD (1p) are coupled to each other by a wiring WL (1p). Similarly, the high-band signal negative path HBn and the input pad IPD (2n) are coupled to each other by a wiring WL (2n). The high-band signal positive path HBp and the input pad IPD (2p) are coupled to each other by a wiring WL (2p).

Thus, in the second embodiment, the low-band signal negative path LBn and the low-band signal positive path LBp are disposed on one side (chip divided region CREG1) relative to the center line CL2 of the semiconductor chip CHP. Further, the high-band signal negative path HBn and the high-band signal positive path HBp are disposed on another side (chip divided region CREG2) relative to the center line CL2 of the semiconductor chip CHP. Since an amplifying path for the low-band signal balance amplifier and an amplifying path for the high-band signal balance amplifier are not disposed so as to transfer transmit signals in the same direction as each other from this point of view, crosstalk between low-band and high-band signals can be suppressed.

Figure 14:
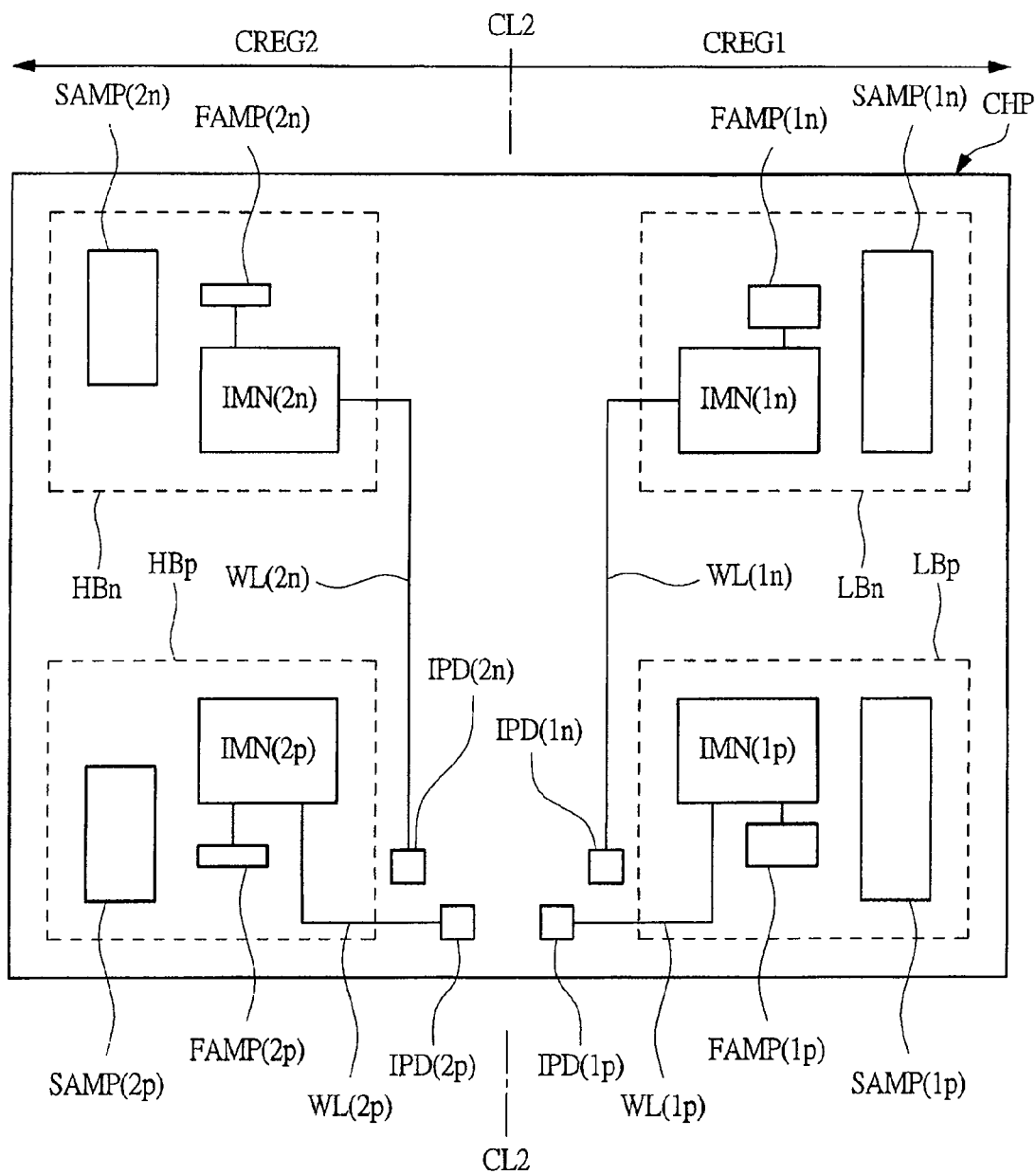
FIG. 14 is a diagram illustrating a layout configuration of the semiconductor chip according to the second embodiment.

A detailed layout configuration of a semiconductor chip CHP will be shown below. FIG. 14 is a diagram showing the detailed layout configuration of the semiconductor chip CHP. For example, an input pad IPD (1n) is coupled to a low-band signal negative path LBn by a wiring WL (1n) as shown in FIG. 14, but the wiring WL (1n) is coupled to an input matching circuit IMN (1n) lying within the low-band signal negative path LBn if described concretely. Then, the input matching circuit IMN (1n) is coupled to a first-stage amplifier FAMP (1n). Further, the first-stage amplifier FAMP (1n) is coupled to a last-stage amplifier SAMP (1n) via an inter-stage matching circuit (not shown).

Similarly, for example, an input pad IPD (1p) is coupled to a low-band signal positive path LBp by a wiring WL (1p), but the wiring WL (1p) is coupled to an input matching circuit IMN (1p) lying within the low-band signal positive path LBp if described concretely. Then, the input matching circuit IMN (1p) is coupled to a first-stage amplifier FAMP (1p). Further, the first-stage amplifier FAMP (1p) is coupled to a last-stage amplifier SAMP (1p) via an inter-stage matching circuit (not shown).

Further, for example, an input pad IPD (2n) is coupled to a high-band signal negative path HBn by a wiring WL (2n), but the wiring WL (2n) is coupled to an input matching circuit IMN (2n) lying within the high-band signal negative path HBn if described concretely. Then, the input matching circuit IMN (2n) is coupled to a first-stage amplifier FAMP (2n). Further, the first-stage amplifier FAMP (2n) is coupled to a last-stage amplifier SAMP (2n) via an inter-stage matching circuit (not shown).

Similarly, for example, an input pad IPD (2p) is coupled to a high-band signal positive path HBp by a wiring WL (2p), but the wiring WL (2p) is coupled to an input matching circuit IMN (2p) lying within the high-band signal positive path HBp if described concretely. Then, the input matching circuit IMN (2p) is coupled to a first-stage amplifier FAMP (2p). Further, the first-stage amplifier FAMP (2p) is coupled to a last-stage amplifier SAMP (2p) via an inter-stage matching circuit (not shown).

When attention is now given to the low-band signal balance amplifier of the balance amplifiers formed in the semiconductor chip CHP, the input matching circuit IMN (1n) and the input pad IPD (1n) in the low-band signal negative path LBn are coupled to each other by the wiring WL (1n). On the other hand, the input matching circuit IMN (1p) and the input pad IPD (1p) in the low-band signal positive path LBp are coupled to each other by the wiring WL (1p). At this time, the input pad IPD (1n) and the input pad IPD (1p) are disposed on the lower side near the center line CL2 in the second embodiment. In contrast, the low-band signal negative path LBn is formed on the upper side in the right region of the center line CL2, and the low-band signal positive path LBp is formed on the lower side in the right region of the center line CL2. Therefore, the length of the wiring WL (1n) for coupling the input pad IPD (1n) and the low-band signal negative path LBn, and the length of the wiring WL (1p) for coupling the input pad IPD (1p) and the low-band signal positive path LBp are considerably different from each other.

It is desirable that while the low-band signal negative path LBn and the low-band signal positive path LBp transfer transmit signals different in phase by 90° from each other, they are substantially the same in configuration other than it. For example, the input matching circuit IMN (1n) in the low-band signal negative path LBn and the input matching circuit IMN (1p) in the low-band signal positive path LBp respectively adjust the phases of the transmit signals inputted thereto. Thus, the phase of the transmit signal outputted from the input matching circuit IMN (1n) in the low-band signal negative path LBn and the phase of the transmit signal outputted from the input matching circuit IMN (1p) in the low-band signal positive path LBp are displaced 90° with respect to each other. Namely, the input matching circuit IMN (1n) and the input matching circuit IMN (1p) are configured in such a manner that the phases of the transmit signals passing therethrough are displaced 90° with respect to each other. If, for example, the length of the wiring WL (1n) for coupling the input pad IPD (1n) and the input matching circuit IMN (1n) and the length of the wiring WL (1p) for coupling the input pad IPD (1p) and the input matching circuit IMN (1p) are the same at this time, then the resistance functions of the wirings WL (1n) and WL (1p) and the inductor functions thereof are brought to the same state. Therefore, the difference in phase developed between the input matching circuit IMN (1n) and the input matching circuit IMN (1p) is accurately reflected on the transmit signals, so that a phase difference of 90° can be held.

On the other hand, if the length of the wiring WL (1n) and the length of the wiring WL (1p) are extremely different as shown in FIG. 14, the parasitic resistance and inductor are formed in each of the wirings WL (1n) and WL (1p) and hence the values of the parasitic resistance and inductor differ therebetween. This causes a fear that even though the input matching circuit IMN (1n) and the input matching circuit IMN (1p) are configured in such a manner that the phases of their transmit signals are displaced 90° with respect to each other, the difference between the phase of the transmit signal transferred through the low-band signal negative path LBn and the phase of the transmit signal transferred through the low-band signal positive path LBp is not brought to 90° in fact due to the difference in influence between the parasitic resistances and/or parasitic inductors of the wirings WL (1n) and WL (1p).

Thus, contrivance for improving the characteristic of each balance amplifier has been given in the second embodiment. Described concretely, contrivance for realizing the function of a phase shifter by combining the input matching circuit IMN (1n) and the wiring WL (1n) without bringing the difference in phase between the transmit signals to 90° by the input matching circuit IMN (1n) and the input matching circuit IMN (1p) alone is made in the second embodiment. Namely, there is a fear that when the phase difference of 90° is formed by the input matching circuit IMN (1n) and the input matching circuit IMN (1p) alone, the difference in phase between the transmit signals is not brought to 90° due to the influence of the wirings WL (1n) and WL (1p) different in length. On the other hand, if the input matching circuit IMN (1n) and the wiring WL (1n) are combined to configure a phase shifter and the difference in phase between the transmit signals is brought to 90° by the phase shifter and the input matching circuit IMN (1p), an influence exerted on the phase of each transmit signal due to the difference in length between the wirings WL (1n) and WL (1p) can be suppressed.

Described concretely, a description will be made of examples of a matching circuit (including phase shifter) formed by combining the input matching circuit IMN (1n) and the wiring WL (1n), and a matching circuit formed by the input matching circuit IMN (1p).

Figure 15:
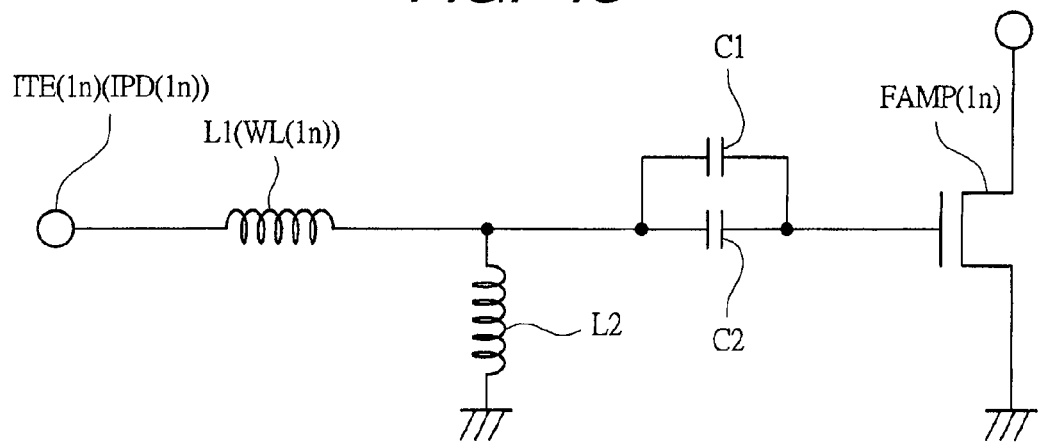
FIG. 15 is a circuit diagram showing one example of a matching circuit at a negative path.

FIG. 15 is a circuit diagram showing an example of a matching circuit in which a wiring WL (1n) and an input matching circuit IMN (1n) are utilized in combination at a low-band signal negative path LBn. In FIG. 15, the matching circuit is formed between an input terminal ITE (1n) (input pad IPD (1n)) and a first-stage amplifier FAMP (1n). For example, an inductor L1 is formed in series with the input terminal ITE (1n), and an inductor L2 is formed between the output of the inductor L1 and ground. Further, a capacitive element C1 and a capacitive element C2 are coupled to the output of the inductor L1. The matching circuit configured in this way is implemented by the combination of the wiring WL (1n) and the input matching circuit IMN (1n). Described concretely, the inductor L1 is comprised of the wiring WL (1n), and the inductor L2, capacitive element C1 and capacitive element C2 are formed in the input matching circuit IMN (1n). Namely, in the second embodiment, the matching circuit is formed in consideration of the fact that the length of the wiring WL (1n) is long and the wiring WL (1n) functions as the inductor. That is, the inductor L1 can be comprised of the wiring WL (1n) by configuring the first passive part coupled to the input terminal ITE (1n) as the series inductor L1. In the second embodiment, the series inductor L1 is disposed and formed at the beginning of the matching circuit coupled to the low-band signal negative path LBn, thereby making it possible to configure the matching circuit including the phase shifter by the wiring WL (1n) and the input matching circuit IMN (1n). Thus, as an example in which the series inductor L1 is placed at the beginning of the matching circuit, may be mentioned, such a configuration that the phase of each transmit signal is shifted by −60° by means of the matching circuit in which the wiring WL (1n) and the input matching circuit IMN (1n) are combined. In the matching circuit at the low-band signal negative path LBn, the inductor L1 is comprised of the wiring WL (1n), and the inductor L2, capacitive element C1 and capacitive element C2 are formed in the semiconductor chip CHP as chip parts (passive parts).

Figure 16:
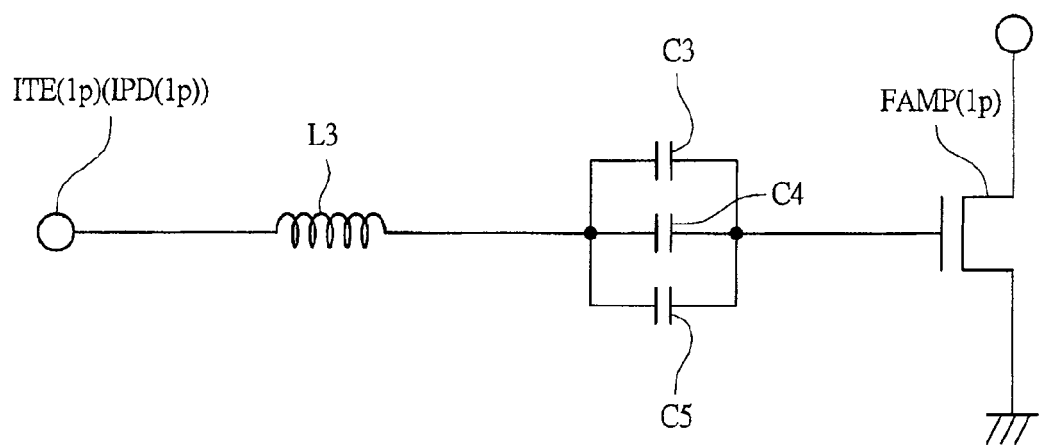
FIG. 16 is a circuit diagram illustrating one example of a matching circuit at a positive path.

Following this, FIG. 16 is a diagram showing a circuit example of an input matching circuit IMN (1p) at a low-band signal positive path LBp. As shown in FIG. 16, an input matching circuit IMN (1p) is formed between an input terminal ITE (1p) (input pad IPD (1p)) and a first-stage amplifier FAMP (1p). For example, an inductor L3 is formed in series with the input terminal ITE (1p), and a capacitive element C3, a capacitive element C4 and a capacitive element C5 are coupled to the output of the inductor L3. In the low-band signal positive path LBp shown in FIG. 16, such a matching circuit as shown in FIG. 16 is formed of the input matching circuit IMN (1p). While the low-band signal positive path LBp is coupled to a wiring WL (1p), the length of the wiring WL (1p) is enough shorter than the length of a wiring WL (1n) and the effect of taking it as a passive part (e.g., inductor) is negligible. Thus, the phase of a transmit signal is adjusted by the input matching circuit IMN (1p) alone at the low-band signal positive path LBp. Since, at this time, the matching circuit (see FIG. 15) that configures the low-band signal negative path LBn takes such a configuration that the phase is shifted by −60° with respect to the transmit signals, the matching circuit (see FIG. 16) that configures the low-band signal positive path LBp takes such a configuration that the phase is shifted by +30° with respect to the transmit signals. Thus, the phase of the transmit signal outputted from the input matching circuit IMN (1n) and the phase of the transmit signal outputted from the input matching circuit IMN (1p) can be shifted by 90°. Incidentally, in the matching circuit at the low-band signal positive path LBp, the inductor L3, the capacitive element C3, the capacitive element C4 and the capacitive element C5 are formed in the semiconductor chip CHP as chip parts (passive parts).

From the above, the fourth feature point of the second embodiment resides in that the low-band signal negative path LBn and the low-band signal positive path LBp are disposed on one side relative to the center line CL2 of the semiconductor chip CHP, and the high-band signal negative path HBn and the high-band signal positive path HBp are disposed on another side relative to the center line CL2 of the semiconductor chip CHP. Judging from the fourth feature point of the second embodiment, the amplifying path for the low-band signal balance amplifier and the amplifying path for the high-band signal balance amplifier may not be disposed so as to transfer the transmit signals in the same direction as each other. It is therefore possible to suppress crosstalk between the low-band and high-band signals.

When the configuration corresponding to the fourth feature point is taken, an adverse effect is developed that the length of the wiring WL (1n) and the length of the wiring WL (1p) become extremely different. Thus, the second embodiment makes positive use of an increase in the length of the wiring WL (1n) in reverse. Namely, the fifth feature point of the second embodiment resides in that contrivance for realizing the function of a phase shifter by combining the input matching circuit IMN (1n) and the wiring WL (1n) without bringing the difference in phase between the transmit signals to 90° by the input matching circuit IMN (1n) and the input matching circuit IMN (1p) alone is made. It is therefore possible to suppress an influence exerted on the phase of each transmit signal due to the difference between the length of the wiring WL (1n) and the length of the wiring WL (1p). As a result, the characteristic of the balance amplifier can be improved. Further, judging from the fifth feature point, the inductor may not be newly formed in the semiconductor chip CHP as a chip part because the wiring WL (1n) is used as the inductor in the second embodiment. This means that the number of passive parts that configure each matching circuit can be reduced. There can be also obtained an advantage in that a reduction in the area of the semiconductor chip CHP can be implemented. Although the fifth feature point of the second embodiment has been explained with the configuration of the low-band signal balance amplifier as the example, the fifth feature point of the second embodiment can similarly be applied even to the configuration of the high-band signal balance amplifier.

<<Layout Configuration within Semiconductor Chip (Sixth Feature Point)>>

Figure 17:
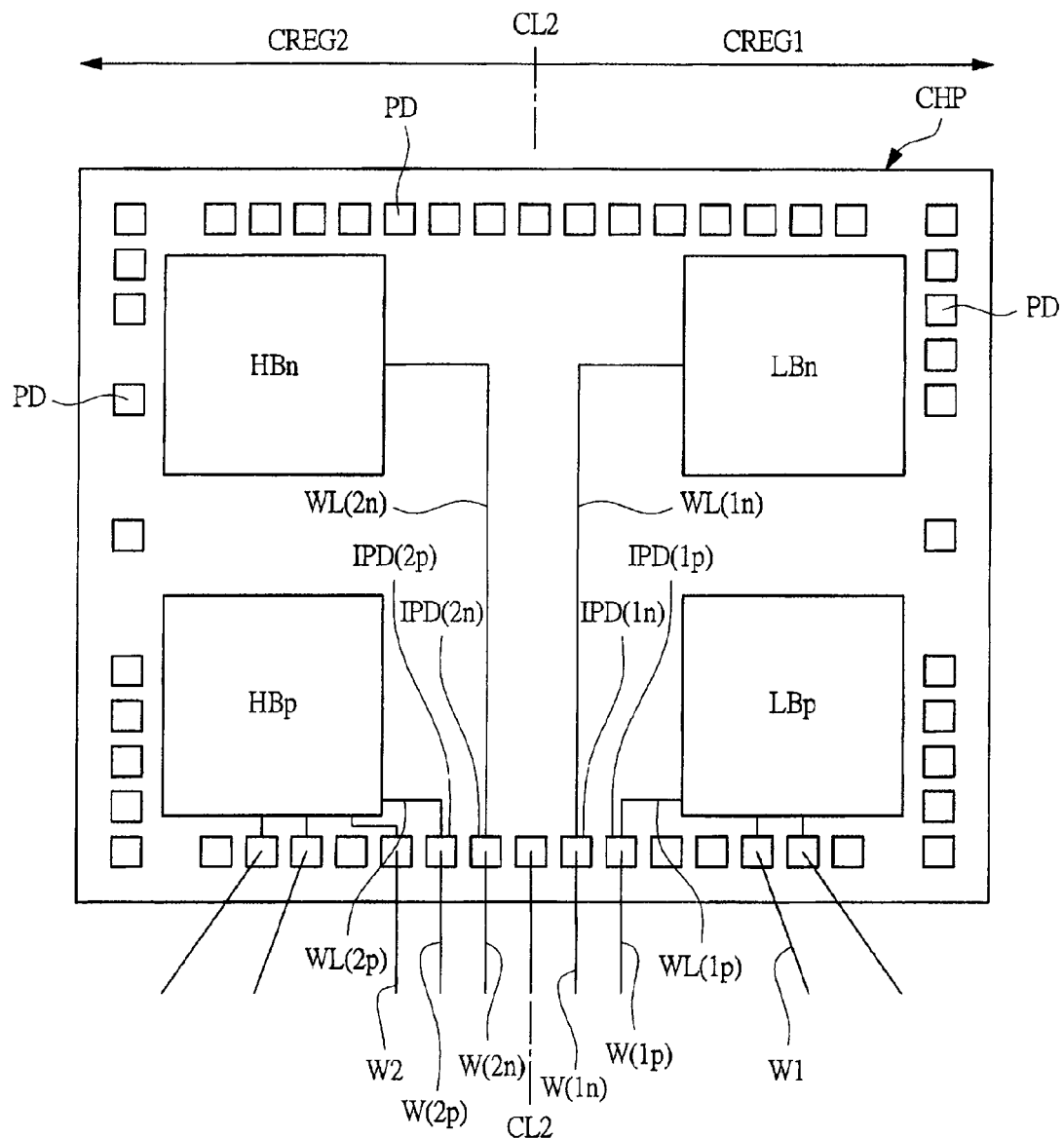
FIG. 17 is a diagram showing a layout configuration of a semiconductor chip according to a comparative example.

A technology (sixth feature point) capable of achieving a further improvement in the characteristic of a balance amplifier will next be explained. FIG. 17 is a diagram showing a semiconductor chip CHP according to a comparative example. In FIG. 17, an input pad IPD (1p) is disposed outside an input pad IPD (1n) (on the right side thereof) in the comparative example. A wiring W (1n) is coupled to the input pad IPD (1n). A wiring W (1p) is coupled to the input pad IPD (1p). Similarly, an input pad IPD (2p) is formed outside an input pad IPD (2n) (on the left side thereof). A wiring W (2n) is coupled to the input pad IPD (2n), and a wiring W (2p) is coupled to the input pad IPD (2p).

On the other hand, a wiring W1 is electrically coupled to a low-band signal positive path LBp via a pad. The wiring W1 transfers a transmit signal outputted to an inter-stage matching circuit of the low-band signal positive path LBp. Similarly, a wiring W2 is electrically coupled to a high-band signal positive path HBp via a pad. The wiring W2 transfers a transmit signal outputted to an inter-stage matching circuit of the high-band signal positive path HBp.

The configuration of such a comparative example causes problems shown below. Namely, in the configuration of the comparative example, the input pad IPD (1p) and the low-band signal positive path LBp are brought close to each other. Described concretely, the wiring W (1p) coupled to the input pad IPD (1p) and the wiring W1 coupled to the pad of the low-band signal positive path LBp approach each other. In this case, when the wiring W (1p) and the wiring W1 run approximately parallel to each other and approach each other, the coupling capacitance between the wirings W (1p) and W1 increases and crosstalk therebetween becomes a problem. Similarly, the input pad IPD (2p) and the high-band signal positive path HBp approach each other in the configuration of the comparative example. Described concretely, the wiring W (2p) coupled to the input pad IPD (2p) and the wiring W2 coupled to the pad of the high-band signal positive path HBp approach each other. In this case, when the wirings W (2P) and W2 are parallel to each other and approach each other, the coupling capacitance between the wirings W (2p) and W2 increases and crosstalk therebetween becomes a problem.

Figure 18:
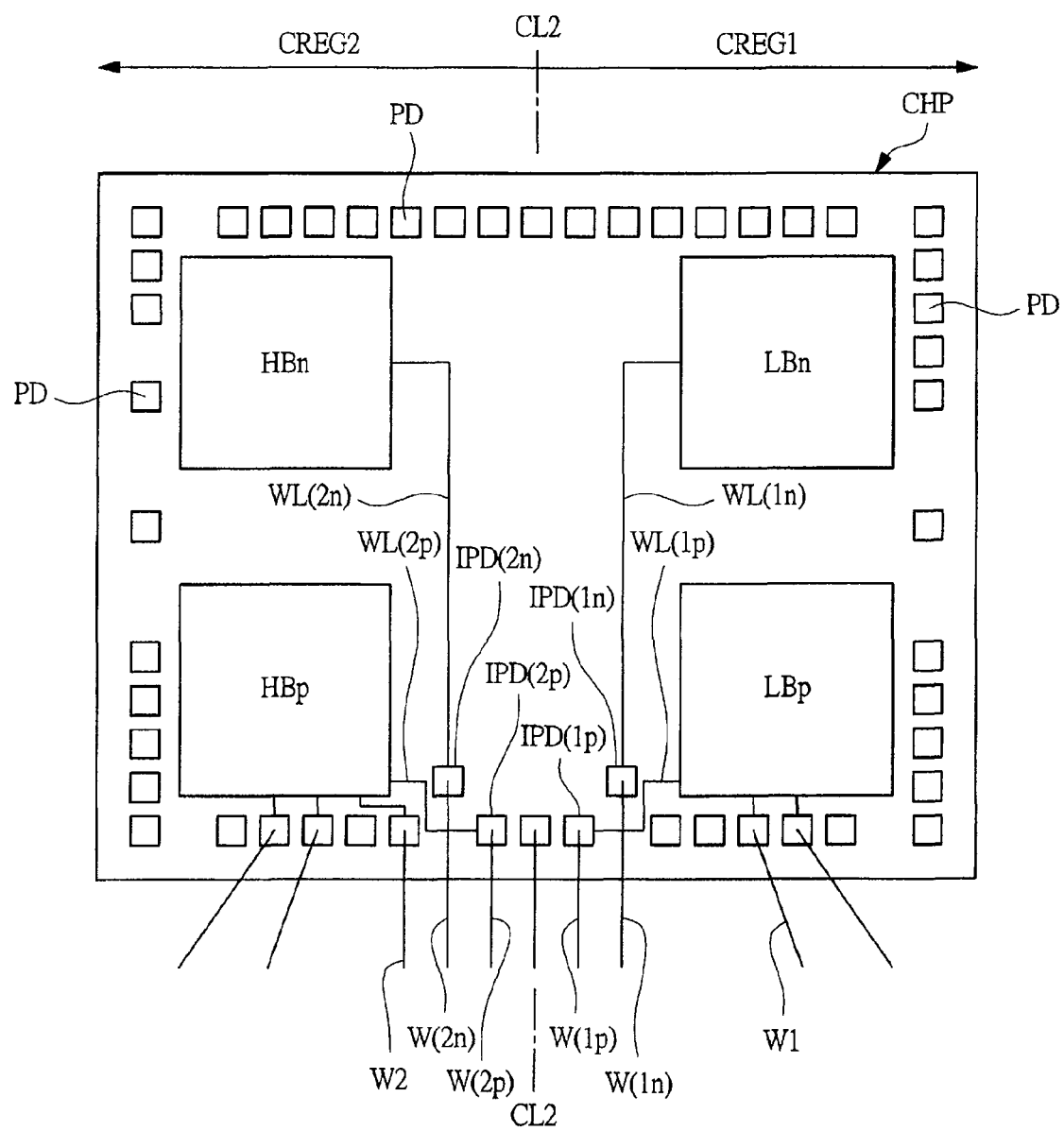
FIG. 18 is a diagram illustrating a layout configuration of the semiconductor chip according to the second embodiment.

Therefore, the second embodiment provides contrivance for suppressing the crosstalk between the wirings W (1p) and W1 and the crosstalk between the wirings W (2p) and W2. FIG. 18 is a diagram showing a configuration of a semiconductor chip CHP according to the second embodiment. In FIG. 18, the sixth feature point of the second embodiment resides in that an input pad IPD (1p) is disposed inside an input pad IPD (1n) (on the left side thereof), and an input pad IPD (2p) is disposed inside an input pad IPD (2n) (on the right side thereof). With the provision of such a configuration, the distance between a wiring W (1p) coupled to the input pad IPD (1p) and a wiring W1 of a low-band signal positive path LBp can be increased. This means that the coupling capacitance between the wirings W (1p) and W1 can be reduced. As a result, crosstalk between a transmit signal transferred through the wiring W (1p) and a transmit signal transferred through the wiring W1 can be suppressed. Similarly, the distance between a wiring W (2p) coupled to the input pad IPD (2p) and a wiring W2 of a high-band signal positive path HBp can be increased. This means that the coupling capacitance between the wirings W (2p) and W2 can be reduced. As a result, crosstalk between a transmit signal transferred through the wiring W (2p) and a transmit signal transferred through the wiring W2 can be suppressed.

At this time, the second embodiment takes such a configuration that the input pad IPD (1p) is disposed inside the input pad IPD (1n) (on the left side thereof) and the input pad IPD (2p) is disposed inside the input pad IPD (2n) (on the right side thereof). This configuration makes it difficult to realize such a configuration that the input pad IPD (1n), input pad IPD (1p), input pad IPD (2p) and input pad IPD (2n) are simply arranged in a row. This is because, for example, the wiring WL (1n) is coupled to the input pad IPD (1n) and the wiring WL (1p) is coupled to the input pad IPD (1p). In this case, when the input pad IPD (1p) is disposed inside the input pad IPD (1n) (on the left side thereof), and the input pad IPD (1p) and the input pad IPD (1n) are disposed side by side in a single row, the wiring WL (1n) coupled to the input pad IPD (1n) lies in the way, so that the input pad IPD (1p) and the low-band signal positive path LBp cannot be coupled by the wiring WL (1p).

Thus, in the second embodiment, the input pad IPD (1p) is disposed inside the input pad IPD (1n) (on the left side thereof), and the input pad IPD (1n) is disposed so as to protrude to the upper side of the input pad IPD (1p). Consequently, the input pad IPD (1p) and the low-band signal positive path LBp can be coupled by the wiring WL (1p) as shown in FIG. 18. In other words, in the second embodiment, the input pad IPD (1n) is provided between the input pad IPD (1p) and the low-band signal positive path LBp, and the input pad IPD (1n) is disposed in a region lying inside the semiconductor chip CHP (its upper-side region) from the wiring WL (1p) for coupling the input pad IPD (1p) and the low-band signal positive path LBp. With the provision of such a configuration, crosstalk between a transmit signal transferred through the wiring W (1p) and a transmit signal transferred through the wiring W1 can be suppressed while ensuring the coupling between the input pad IPD (1p) and the low-band signal positive path LBp.

Incidentally, this configuration is applied even to a high-band signal balance amplifier. Namely, the input pad IPD (2n) is provided between the input pad IPD (2p) and the high-band signal positive path HBp. Further, the input pad IPD (2n) is disposed in a region lying inside the semiconductor chip CHP (its upper-side region) from the corresponding wiring WL (2p) for coupling the input pad IPD (2p) and the high-band signal positive path HBp. With the provision of such a configuration, crosstalk between a transmit signal transferred through the wiring W (2p) and a transmit signal transferred through the wiring W2 can be suppressed while ensuring the coupling between the input pad IPD (2p) and the high-band signal positive path HBp.

As to the sixth feature point of the second embodiment here, attention is given to the low-band signal balance amplifier, for example. Although crosstalk can be suppressed by increasing the distance between the wirings W (1p) and W1, the distance between the wirings W (1n) and W1 decreases. Therefore, whether the crosstalk between the wirings W (1n) and W1 becomes a problem remains open to some doubt. Suppressing the crosstalk between the wirings W (1n) and W1 is however more important and is a matter of high priority. The wiring W (1p) transfers a transmit signal inputted to the low-band signal positive path LBp, and the wiring W1 transfers a transmit signal outputted to the corresponding inter-stage matching circuit of the low-band signal positive path LBp. Namely, the wirings W (1p) and W1 transfer the transmit signals used in the same low-band signal positive path LBp. Assume that, for example, crosstalk occurs between the wirings W (1p) and W1. In this case, noise occurs in the transmit signal transferred through the wiring W (1p). In doing so, the transmit signal transferred through the wiring W (1p) is inputted to the low-band signal positive path LBp and amplified by, for example, a first-stage amplifier, so that noise is also amplified. Then, the transmit signal amplified by the first-stage amplifier is transferred through the wiring W1 following the inter-stage matching circuit. When the transmit signal is transferred through the wiring W1, crosstalk occurs between the wiring W1 and the wiring W (1p) close to the wiring W1. While the amplified transmit signal is transferred through the wiring W1 at this time, noise is also amplified. Accordingly, noise overlaid on the wiring W (1p) from the wiring W1 also becomes large. Thereafter, the transmit signal transferred through the wiring W (1p) is amplified again by the first-stage amplifier in a state in which large noise is being developed, so that the noise is also amplified. When crosstalk occurs between the wiring W (1p) and the wiring W1 occurs due to it, noise increases during such a negative cycle.

On the other hand, the wirings W (1n) and W1 respectively transfer transmit signals used in other amplifying paths called low-band signal negative path LBn and low-band signal positive path LBp. A negative cycle during which noise increases does no exist as in the case of crosstalk between the wirings W (1p) and W1. From this point of view, it become important to suppress crosstalk between the wirings W (1p) and W1 that transfer transmit signals used in the same low-band signal positive path LBp.

Thus, in the second embodiment, the input pad IPD (1p) is disposed inside the input pad IPD (1n) (on the left side thereof), and the input pad IPD (2p) is disposed inside the input pad IPD (2n) (on the right side thereof). Consequently, the crosstalk between the transmit signal transferred through the wiring W (1p) and the transmit signal transferred through the wiring W1, and the crosstalk between the transmit signal transferred through the wiring W (2p) and the transmit signal transferred through the wiring W2 can be suppressed.

While the invention made above by the present inventors has been described specifically on the basis of the preferred embodiments, the present invention is not limited to the embodiments referred to above. It is needless to say that various changes can be made thereto within the scope not departing from the gist thereof.

What is claimed is:

1. A semiconductor device comprising a balance amplifier type power amplifier comprising a balance amplifier type first power amplifier comprised of an amplifier for a first negative path and an amplifier for a first positive path, and a second power amplifier comprised of an amplifier for a second negative path and an amplifier for a second positive path, said semiconductor device comprising:
   (a) a wiring board;
   (b) a semiconductor chip mounted over the wiring board and comprising a plurality of transistors that configure the first power amplifier and the second power amplifier respectively:
   (c1) a first matching circuit electrically coupled to the amplifier for the first negative path;
   (c2) a second matching circuit electrically coupled to the amplifier for the first positive path;
   (c3) a third matching circuit electrically coupled to the amplifier for the second negative path; and
   (c4) a fourth matching circuit electrically coupled to the amplifier for the second positive path,
   wherein the semiconductor chip has two pairs of edges which includes a first edge,
   wherein the semiconductor chip comprises first and second regions divided by a first straight line that passes through a center of the semiconductor chip,
   wherein the first matching circuit, the third matching circuit, the negative path of the first power amplifier and the negative path of the second power amplifier are disposed in the first region lying over the semiconductor chip,
   wherein the second matching circuit, the fourth matching circuit, the positive path of the first power amplifier and the positive path of the second power amplifier are disposed in the second region lying over the semiconductor chip,
   wherein the first matching circuit and the second matching circuit are disposed symmetrically with respect to the first straight line,
   wherein the third matching circuit and the fourth matching circuit are disposed symmetrically with respect to the first straight line,
   wherein a shortest distance between the first positive path and the first edge is smaller than a shortest distance between the first negative path of the first power amplifier and the first edge,
   wherein the first matching circuit couples to a first pad via a first wiring line,
   wherein the second matching circuit couples to a second pad via a second wiring line, and
   wherein a shortest distance between the second pad and the first edge is smaller than a shortest distance between the first pad and the first edge.

2. The semiconductor device according to claim 1,
   wherein the semiconductor chip has a first chip divided region and a second chip divided region divided by a second straight line that passes through the center of the semiconductor chip and is orthogonal to the first straight line,
   wherein the first power amplifier is disposed in the first chip divided region of the semiconductor chip,
   wherein the second power amplifier is disposed in the second chip divided region of the semiconductor chip, and
   wherein the first pad and the second pad are disposed in the second region.

3. The semiconductor device according to claim 2,
wherein a shortest distance between the first pad and the first power amplifier is smaller than a shortest distance between the second pad and the first power amplifier.

4. The semiconductor device according to claim 3,
wherein a first phase shifter of the amplifier for the first negative path is constructed by the first matching circuit and the first wiring line, and
wherein a second phase shifter of the amplifier for the first positive path is constructed by the second matching circuit.

5. The semiconductor device according to claim 4,
wherein the first pad couples to a first wire, and
wherein the second pad couples to a second wire.

6. The semiconductor device according to claim 4,
wherein the third matching circuit couples to a third pad via a third wiring line,
wherein the fourth matching circuit couples to a fourth pad via a fourth wiring line, and
wherein a shortest distance between the fourth pad and the edge is smaller than a shortest distance between the third pad and the edge.

7. The semiconductor device according to claim 6,
wherein the first to fourth pads are inputted transmit signals from outside of the semiconductor device.

8. The semiconductor device according to claim 6,
wherein a shortest distance between the third pad and the second power amplifier is smaller than a shortest distance between the fourth pad and the first power amplifier.

9. The semiconductor device according to claim 4,
wherein a third phase shifter of the amplifier for the second negative path is constructed by the third matching circuit and the third wiring line, and
wherein a fourth phase shifter of the amplifier for the second positive path is constructed by the fourth matching circuit.

10. The semiconductor device according to claim 9,
wherein the first and second pads are input transmit signals from outside of the semiconductor device.

\* \* \* \* \*